US011751347B2

(12) United States Patent
Suzuki

(10) Patent No.: US 11,751,347 B2
(45) Date of Patent: *Sep. 5, 2023

(54) ELECTRONIC APPARATUS

(71) Applicant: Kioxia Corporation, Tokyo (JP)

(72) Inventor: Akitoshi Suzuki, Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/660,075

(22) Filed: Apr. 21, 2022

(65) Prior Publication Data

US 2022/0248554 A1 Aug. 4, 2022

Related U.S. Application Data

(63) Continuation of application No. 17/120,982, filed on Dec. 14, 2020, now Pat. No. 11,357,123, which is a continuation of application No. 16/662,558, filed on Oct. 24, 2019, now Pat. No. 10,905,021, which is a continuation of application No. 15/824,125, filed on Nov. 28, 2017, now Pat. No. 10,512,182.

(30) Foreign Application Priority Data

Feb. 22, 2017 (JP) ................................ 2017-031040
Aug. 1, 2017 (JP) ................................ 2017-149384

(51) Int. Cl.
*H05K 5/02* (2006.01)
*H05K 7/20* (2006.01)
(Continued)

(52) U.S. Cl.
CPC .......... *H05K 5/0269* (2013.01); *G06F 1/182* (2013.01); *G06F 3/0688* (2013.01);
(Continued)

(58) Field of Classification Search
CPC ........................... H05K 5/0269; H05K 5/0213
See application file for complete search history.

(56) References Cited

U.S. PATENT DOCUMENTS 5,563,450 A 10/1996 Bader
6,460,772 B1 10/2002 Stahl
(Continued)

FOREIGN PATENT DOCUMENTS

JP 10-173375 6/1998
JP 2001-111262 4/2001
(Continued)

OTHER PUBLICATIONS

"Implementation Guidance for FIPS PUB 140-2 and the Cryptographic Module Validation Program", National Institute of Standards and Technology Communications Security Establishment, http://csrc.nist.gov/groups/STM/cmvp/documents/fips140-2/FIPS1402IG.pdf, 2017, 216 pages.

Primary Examiner — Mukundbhai G Patel
(74) Attorney, Agent, or Firm — Oblon, McClelland, Maier & Neustadt, L.L.P.

(57) ABSTRACT

According to an embodiment, an electronic apparatus includes a printed circuit board including a plurality of devices that include a nonvolatile memory package and a controller package configured to control the nonvolatile memory package, and a housing accommodating the printed circuit board. The housing includes an opening on a surface constituting the housing. An encryption device among the plurality of devices is present in a first region. The first region is a region on the printed circuit board that is not irradiated with light emitted from a light source placed at the opening. The encryption device is a device used for an encryption process of data to be stored into the nonvolatile memory package.

20 Claims, 20 Drawing Sheets

(51) Int. Cl.
  *G06F 3/06*    (2006.01)
  *G06F 1/18*    (2006.01)
  *H05K 1/02*    (2006.01)
  *H05K 1/14*    (2006.01)

(52) U.S. Cl.
  CPC ....... *H05K 7/20472* (2013.01); *H05K 1/0275* (2013.01); *H05K 1/144* (2013.01); *H05K 7/20454* (2013.01); *H05K 2201/042* (2013.01); *H05K 2201/10159* (2013.01)

(56)         References Cited

U.S. PATENT DOCUMENTS

| | | |
|---|---|---|
| 8,879,263 B2 | 11/2014 | Gunderson |
| 9,078,357 B2 | 7/2015 | Gunderson |
| 2007/0274032 A1* | 11/2007 | Ni ........................ H05K 5/0269 361/679.31 |
| 2011/0038123 A1 | 2/2011 | Janik |
| 2011/0199748 A1* | 8/2011 | Kagawa ............. H05K 7/20436 361/796 |
| 2014/0085818 A1 | 3/2014 | Lee |
| 2017/0060199 A1 | 3/2017 | Kim |
| 2017/0220293 A1 | 8/2017 | Kim |

FOREIGN PATENT DOCUMENTS

| | | |
|---|---|---|
| JP | 2002-110896 | 4/2002 |
| JP | 2009-170760 | 7/2009 |
| JP | 2011-170566 | 9/2011 |
| JP | 2014-032655 A | 2/2014 |
| JP | 2015-201984 | 11/2015 |

* cited by examiner

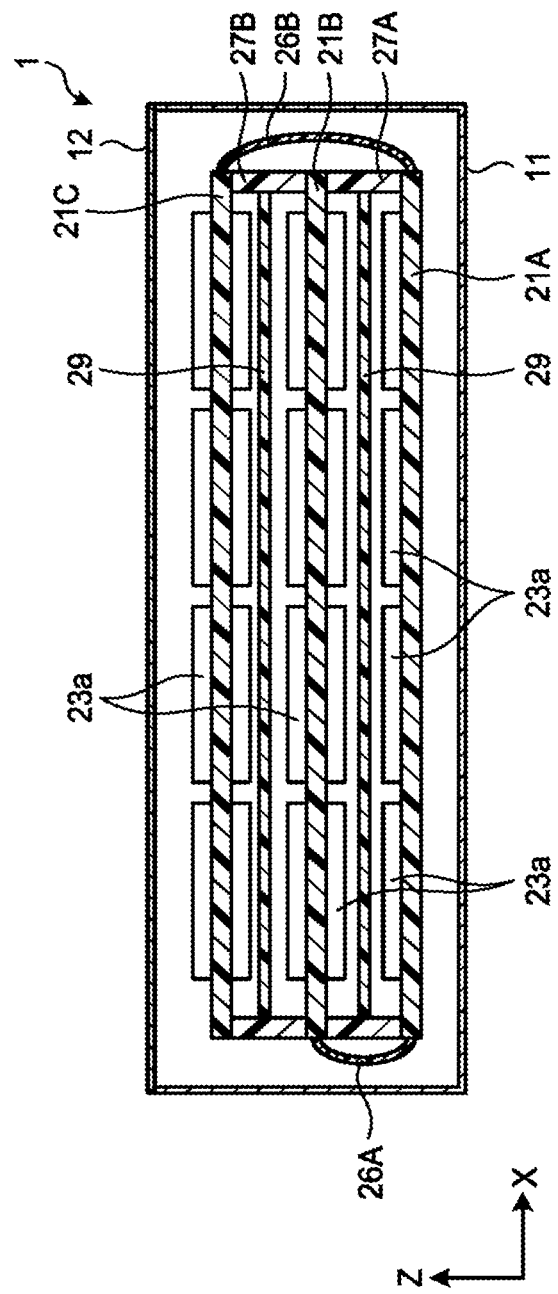

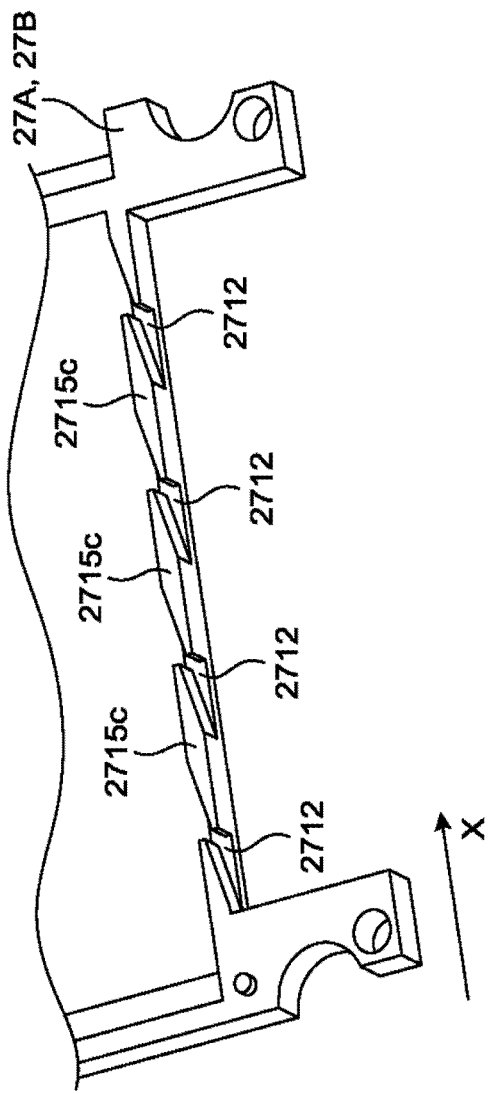

ELECTRONIC APPARATUS

CROSS-REFERENCE TO RELATED APPLICATIONS

This application is a continuation of U.S. application Ser. No. 17/120,982, filed Dec. 14, 2020, which is a continuation of U.S. application Ser. No. 16/662,558, filed Oct. 24, 2019, which is a continuation of U.S. application Ser. No. 15/824,125, filed Nov. 28, 2017, which is based upon and claims the benefit of priority from Japanese Patent Application No. 2017-031040, filed on Feb. 22, 2017 and Japanese Patent Application No. 2017-149384, filed on Aug. 1, 2017; the entire contents of all of which are incorporated herein by reference.

FIELD

Embodiments described herein relate generally to an electronic apparatus.

BACKGROUND

An electronic apparatus is known in which a housing accommodates boards with packages mounted thereon and the packages contain a nonvolatile semiconductor memory and a controller for controlling the nonvolatile memory. In this electronic apparatus, a base or cover constituting the housing is provided with openings for attaching and detaching connectors.

In the case of the conventional structure, the packages or the like mounted on the boards can be visually observed through the openings. On the other hand, there is a demand that the production number or model number of a package, such as a package for constituting a controller, should be protected from visual observation. However, according to the conventional structure of the electronic apparatus, it is difficult to satisfy this demand.

BRIEF DESCRIPTION OF THE DRAWINGS

FIGS. 9A and 9B are sectional views illustrating an example of an internal configuration of an electronic apparatus according to a second embodiment;

FIG. 14 is a perspective view illustrating another example of the ventilation mechanism of a frame according to the second embodiment;

DETAILED DESCRIPTION

According to one embodiment, an electronic apparatus includes a printed circuit board including a plurality of devices that include a nonvolatile memory package and a controller package configured to control the nonvolatile memory package, and a housing accommodating the printed circuit board. The housing includes an opening on a surface constituting the housing. An encryption device among the plurality of devices is present in a first region. The first region is a region on the printed circuit board that is not irradiated with light emitted from a light source placed at the opening. The encryption device is a device used for an encryption process of data to be stored into the nonvolatile memory package.

Exemplary embodiments of an electronic apparatus will be explained below in detail with reference to the accompanying drawings. The present invention is not limited to the following embodiments.

First Embodiment

Figure 1:
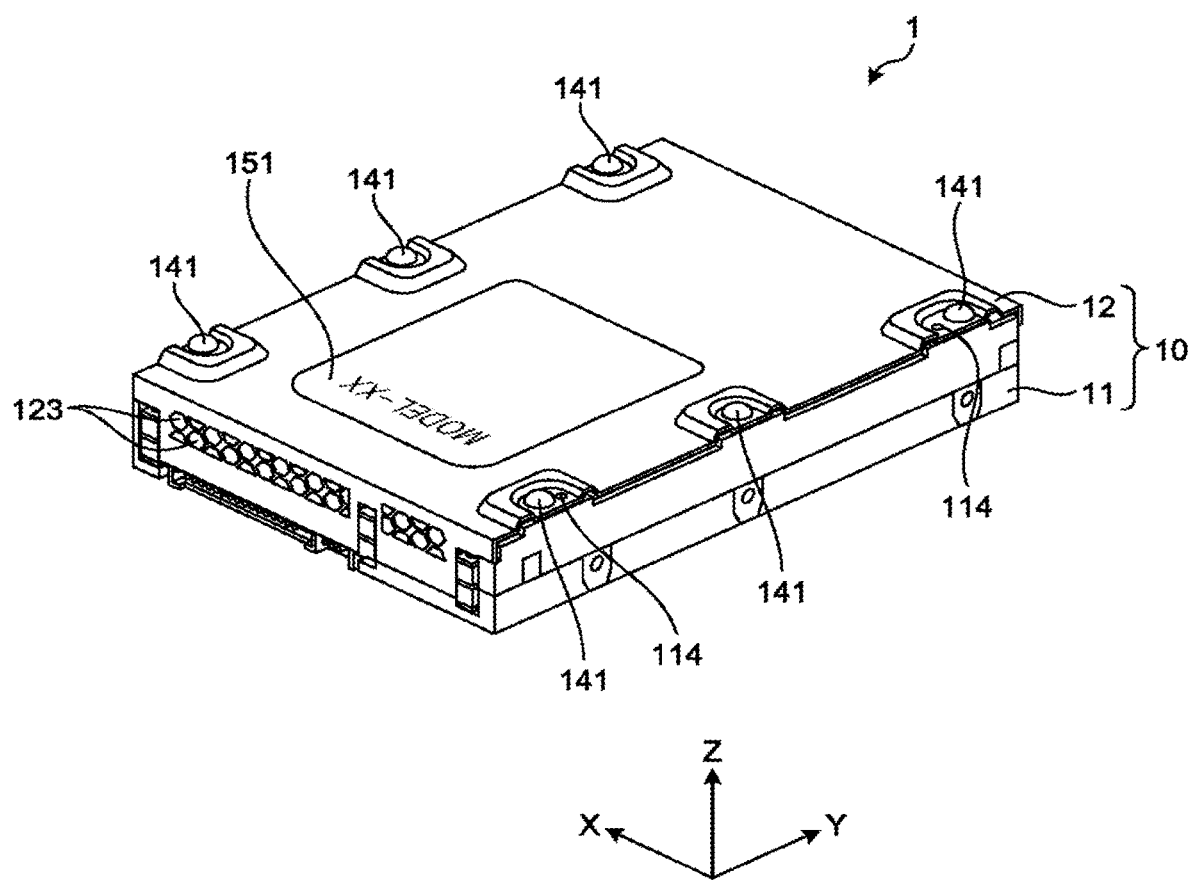
FIG. 1 is a perspective view illustrating an example of an appearance configuration of an electronic apparatus according to a first embodiment.
Figure 2:
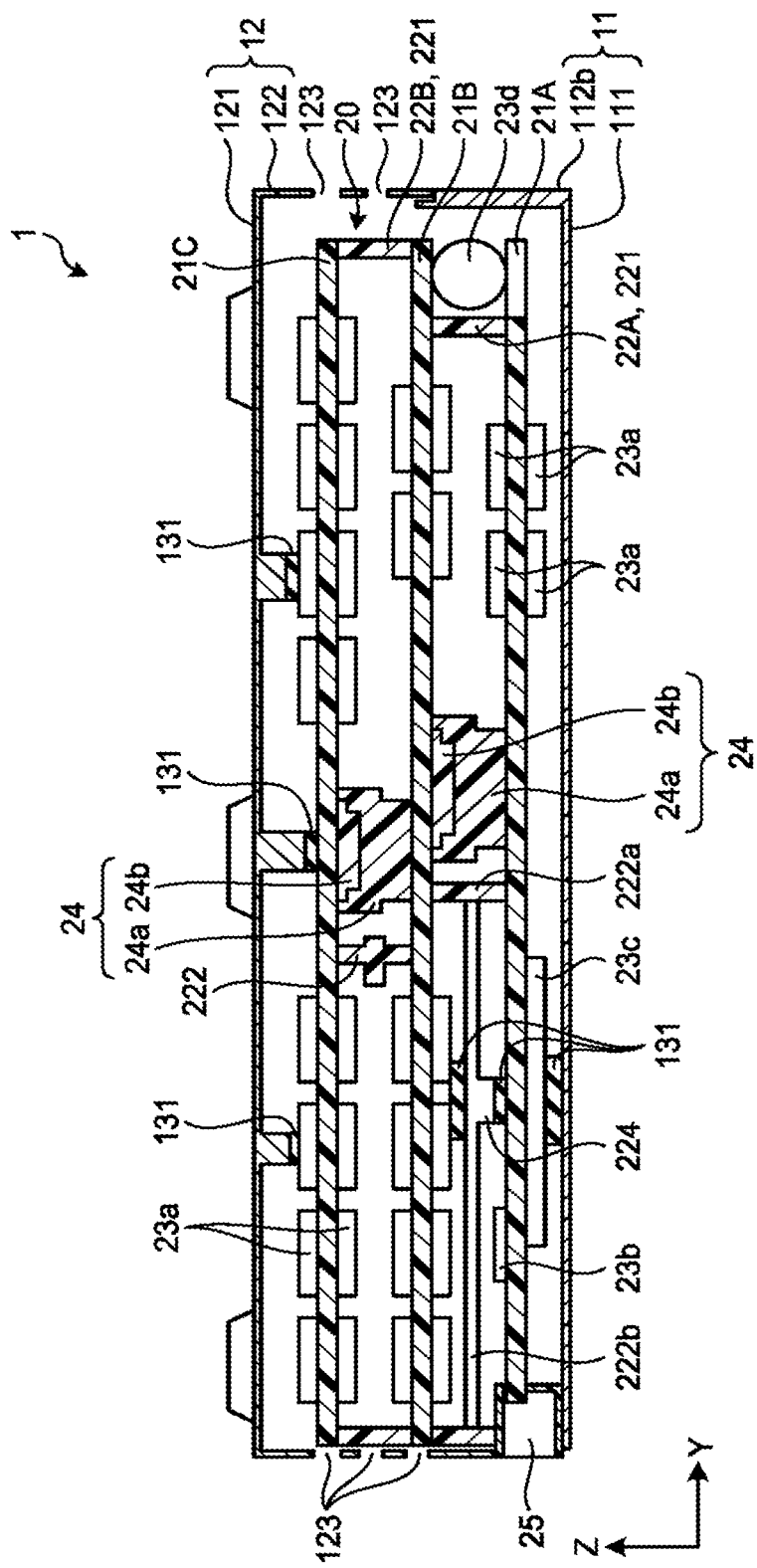
FIG. 2 is a sectional view illustrating an example of an internal configuration of the electronic apparatus according to the first embodiment.
Figure 3:
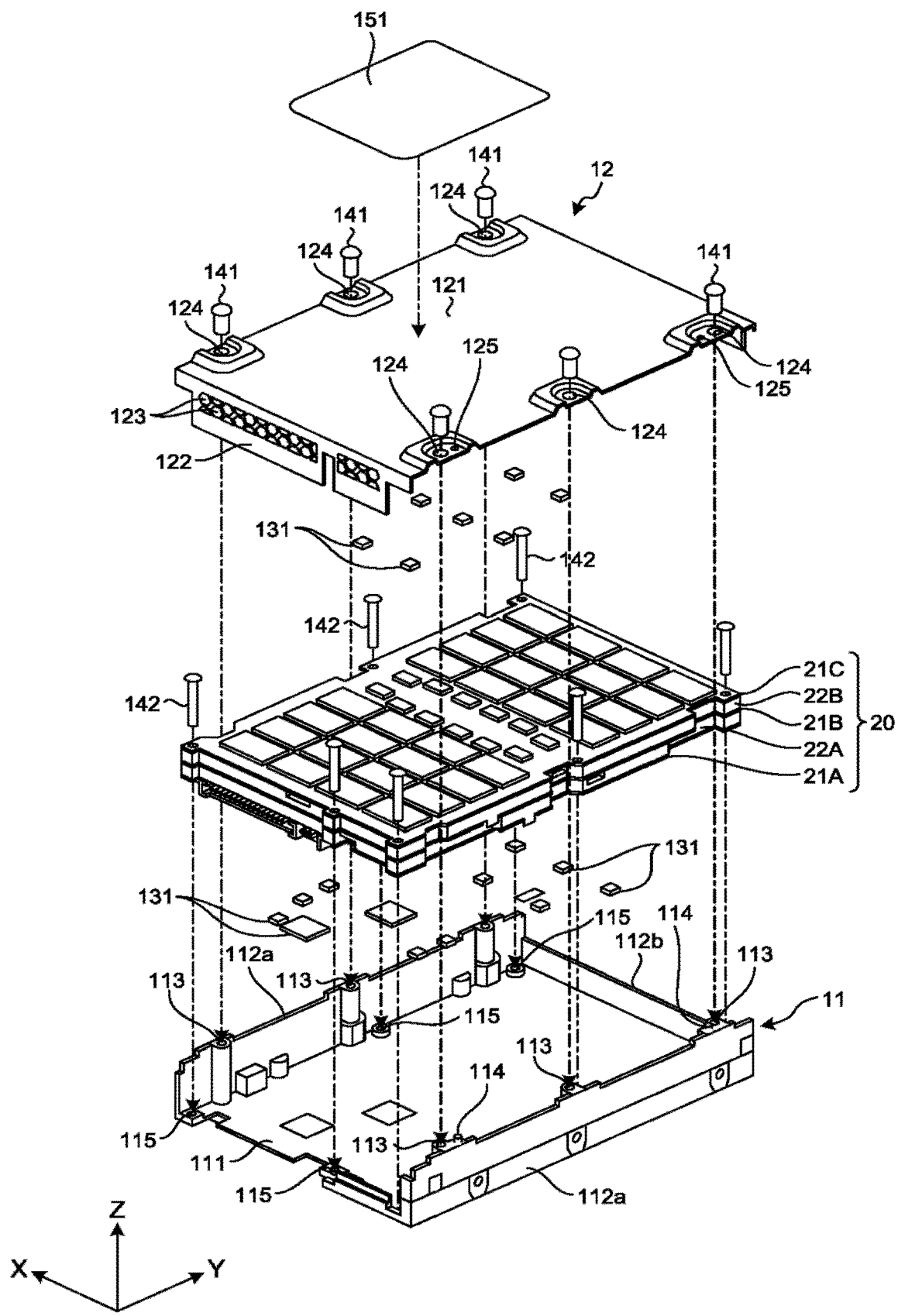
FIG. 3 is an exploded perspective view illustrating an example of the electronic apparatus according to the first embodiment.
Figure 4:
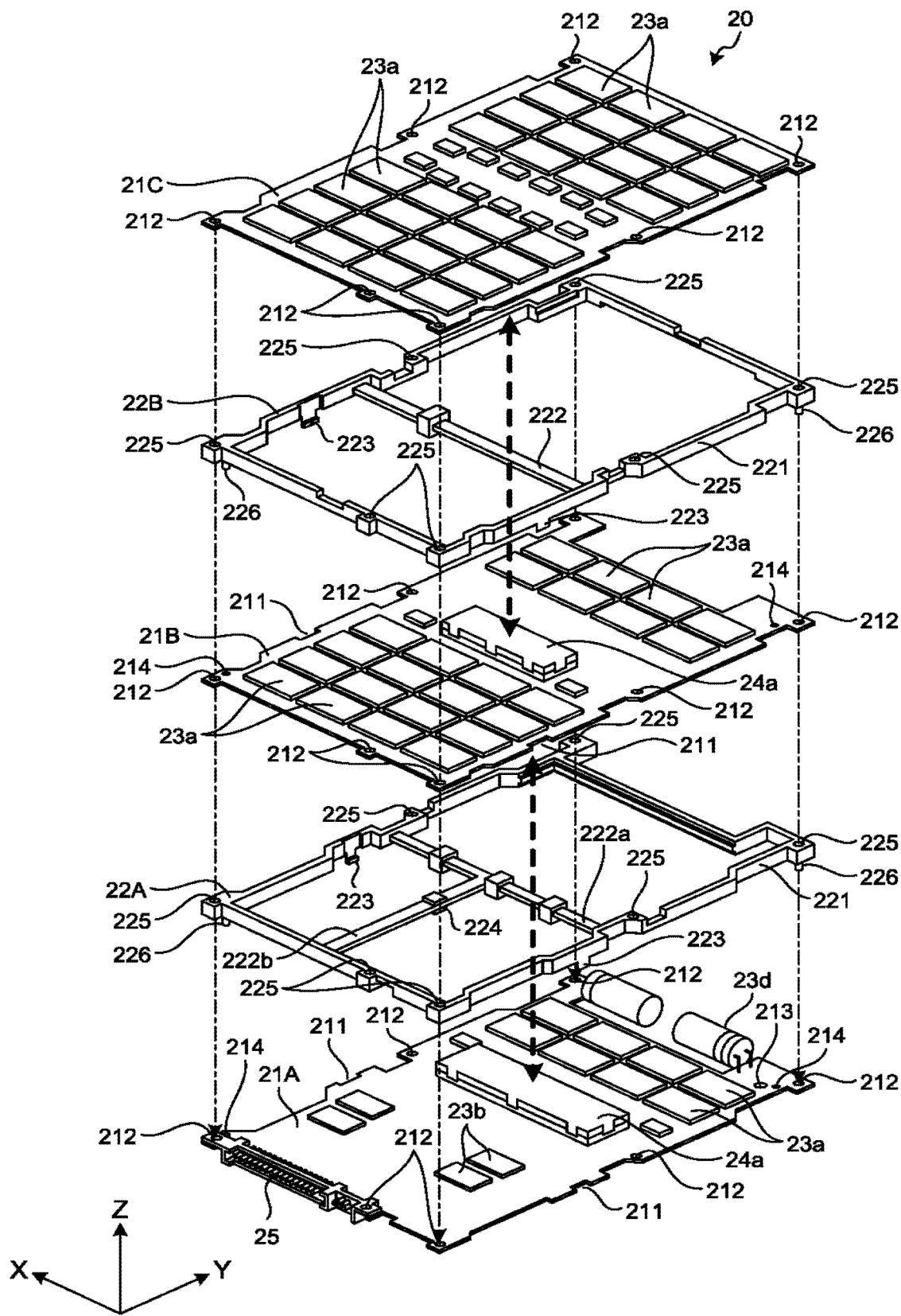
FIG. 4 is an exploded perspective view illustrating an example of a board assembly according to the first embodiment.

FIG. 1 is a perspective view illustrating an example of an appearance configuration of an electronic apparatus according to a first embodiment. FIG. 2 is a sectional view illustrating an example of an internal configuration of the electronic apparatus according to the first embodiment. FIG. 3 is an exploded perspective view illustrating an example of the electronic apparatus according to the first embodiment. FIG. 4 is an exploded perspective view illustrating an example of a board assembly according to the first embodiment. Hereinafter, the electronic apparatus will be exemplified by a Solid State Drive (SSD) that uses a nonvolatile memory as a storage medium. Further, hereinafter, for the sake of convenience, it is assumed that the latitudinal direction of the rectangular top surface or bottom surface of the electronic apparatus is an X-direction, its longitudinal direction is a Y-direction, and its thickness direction is a Z-direction. Furthermore, hereinafter, the relative positional relations of components arranged in the Z-direction, i.e., their relations in the vertical direction, will be illustrated, by using the arrangement state of the electronic apparatus illustrated in FIGS. 1 and 2 as a reference.

The electronic apparatus 1 has a flat rectangular parallelepiped shape as its physical appearance. The electronic apparatus 1 includes a housing 10 having a hollow rectangular parallelepiped shape, and a board assembly 20 including one or more boards accommodated in the housing 10.

The housing 10 includes a base 11 and a cover 12. The base 11 includes a bottom wall 111 like a flat plate, and side walls 112a and 112b perpendicularly extending upward in the Z-direction from the outer periphery of the bottom wall 111. In this example, the base 11 is provided with a pair of side walls 112a each having a surface perpendicular to the X-direction, and a single side wall 112b arranged at one end in the Y-direction and having a surface perpendicular to the Y-direction.

The side walls 112a are provided with screw holes 113 extending in the Z-direction. The thickness of the side walls 112a is set larger at the portions formed with the screw holes 113 than at the other portions. In this example, the screw holes 113 are arranged near the both ends and near the center in the Y-direction.

Further, the side walls 112a are provided with a plurality of pins 114. The pins 114 are disposed on the side walls 112a and projected upward in the Z-direction (i.e., toward the cover 12). In this example, the pins 114 are arranged at two places near the screw holes 113 provided on the side walls 112a. The pins 114 are provided to perform positioning in the X-direction and Y-direction to the cover 12 with respect to the base 11 at the time of placing the cover 12 onto the base 11. Accordingly, the cover 12 is provided with through holes 125 for inserting the pins 114 therein, at the corresponding positions.

The bottom wall 111 of the base 11 is provided with screw holes 115. The screw holes 115 are provided to fix the board assembly 20 to the base 11 by fasteners, such as screws 142. Further, the bottom wall 111 of the base 11 is provided with a pin (not illustrated). The pin is disposed on the bottom wall 111 and projected upward in the Z-direction. The pin may be disposed on a pedestal (not illustrated) provided on the bottom wall 111. The pin is provided to perform positioning in the X-direction and Y-direction to the board assembly 20 with respect to the base 11. Accordingly, a printed circuit board 21A to be arranged at the lowermost side is provided with a through hole 213 for inserting this pin therein, at the corresponding position.

The cover 12 includes a top wall 121 like a flat plate, and side walls 122 perpendicularly extending downward in the Z-direction from the outer periphery of the top wall 121. In this example, the cover 12 is provided with a pair of side walls 122 each having a surface perpendicular to the Y-direction. Further, the side walls 122 are provided with ventilation holes 123 for cooling, which allow air to flow between the outside and inside of the housing 10.

Heat conductive sheets 131 serving as heat conductive members are provided at predetermined positions on the bottom wall 111 of the base 11 and the top wall 121 of the cover 12. Each heat conductive sheet 131 is made of silicone resin, for example, and has thermally conductive and electrically insulating properties, as well as an elastic property. Each heat conductive sheet 131 is provided to conduct heat generated by a device on the board assembly 20 to the base 11 or cover 12, to suppress a temperature rise inside the housing 10. Accordingly, the heat conductive sheets 131 are arranged to be in contact with devices on the upper surface of the board assembly 20 and the top wall 121 of the cover 12, and to be in contact with devices on the lower surface of the board assembly 20 and the bottom wall 111 of the base 11.

The cover 12 is provided with through holes 124 for inserting screws 141 therein, and the through holes 125 for inserting the pins 114 therein. The through holes 124 for inserting the screws 141 are arranged at the positions corresponding to the screw holes 113 of the base 11. The through holes 125 for inserting the pins 114 are arranged at the positions corresponding to the pins 114 of the base 11. Further, a nameplate label 151 with information, such as the model number of the electronic apparatus 1, described therein is stuck to the upper surface of the cover 12.

The base 11 and the cover 12, which constitute the housing 10, are made of aluminum die cast or the like superior in heat radiation property.

The board assembly 20 includes one or more printed circuit boards as the boards. When the board assembly 20 includes one printed circuit board, the printed circuit board is fixed to the housing 10 by fasteners. Further, when the board assembly 20 includes a plurality of printed circuit boards, the board assembly 20 further includes one or more spacers, and the printed circuit boards and the spacers are alternately stacked in the Z-direction, and are fixed by fasteners. In this example, the board assembly 20 has a structure in which three printed circuit boards 21A, 21B, and 21C and two spacers 22A and 22B are alternately stacked in the Z-direction.

On the respective printed circuit boards 21A to 21C, devices are mounted. The devices are circuit components, which include nonvolatile memory packages 23a, volatile memory packages 23b, a controller package 23c, and capacitors 23d. Each nonvolatile memory package 23a has a configuration such that a nonvolatile semiconductor memory chip using a NAND type flash memory, for example, is packaged by heat resistant resin, ceramics, or the like. Each volatile memory package 23b has a configuration such that a Dynamic Random Access Memory (DRAM) chip or a Static RAM (SRAM) chip is packaged by heat resistant resin, ceramics, or the like. The controller package 23c has a configuration such that a controller chip for controlling the nonvolatile memory packages 23a and the volatile memory packages 23b is packaged by heat resistant resin, ceramics, or the like. The controller package 23c is formed of a System-on-a-Chip (SoC), for example. Each capacitor 23d plays a role to assist the supply of power supplied from a host apparatus to which the electronic apparatus 1 is connected.

The controller package 23c serves to control the exchange of data with the host apparatus. Specifically, upon receiving a data write command from the host apparatus, the controller package 23c temporarily stores data to be written, into a write buffer provided in the volatile memory packages 23b, and writes the data stored in the write buffer into the position corresponding to a specified address inside the nonvolatile memory packages 23a. Further, upon receiving a data read command from the host apparatus, the controller package 23c reads data from the position corresponding to a specified address inside the nonvolatile memory packages 23a, and temporarily stores the read data into a read buffer provided in the volatile memory packages 23b. Then, the controller package 23c sends the data stored in the read buffer to the host apparatus.

Further, the controller package 23c includes a function of encrypting data to be written at the time of writing the data into the nonvolatile memory packages 23a, and a function of decrypting the encrypted data at the time of reading the data from the nonvolatile memory packages 23a. When the controller package 23c performs the encryption process and decrypting process of this kind (which will be simply referred to as "encryption process") by itself, the controller package 23c is considered as an encryption module (encryption device). On the other hand, when another package is used in addition to the controller package 23c to perform the encryption process, such that, for example, data to be treated by the encryption process is read into the volatile memory packages 23b to perform the encryption process, each of the packages associated with the encryption process is considered as the encryption module. Alternatively, when a dedicated hardware, such as a dedicated circuit, is used to perform the encryption process, without using the controller package 23c, the dedicated hardware is considered as the encryption module.

Each device is mounted on at least one of the two main surfaces of each of the printed circuit boards 21A to 21C by, for example, surface mounting or the like. In this example, the controller package 23c is arranged on the lower surface of the lowermost printed circuit board 21A, and the volatile memory packages 23b and the capacitors 23d are arranged on the upper surface of the lowermost printed circuit board 21A. Further, the nonvolatile memory packages 23a are arranged on the upper surface and lower surface of each of the printed circuit boards 21A to 21C.

In addition to the devices, the printed circuit boards 21A to 21C are provided with board-to-board connectors 24 that mutually and electrically connect the individual printed circuit boards stacked in the Z-direction. The board-to-board connectors 24 are mounted on the respective printed circuit boards 21A to 21C by surface mounting. The board-to-board connectors 24 are arranged at positions that are opposite to each other when the printed circuit boards 21A to 21C are superposed in an aligned state. The board-to-board connectors 24 include a female type connector 24a as one type and a male type connector 24b as the other type, which can be mutually fitted to achieve electrical connection between the printed circuit boards 21A to 21C. Thus, when the printed circuit boards 21A to 21C are mutually connected by the board-to-board connectors 24, the printed circuit boards 21A to 21C are relatively firmly connected to each other.

The printed circuit board 21A arranged at the lowermost side is provided with the female type connector 24a on the upper surface. The printed circuit board 21C arranged at the uppermost side is provided with the male type connector 24b on the lower surface. The printed circuit board 21B arranged at the middle is provided with the male type connector 24b on the lower surface, and the female type connector 24a on the upper surface. Further, the lowermost printed circuit board 21A is provided with a connector 25 at one end in the Y-direction, such that the connector 25 is to be electrically connected to the host apparatus present outside. As the standard of the connector 25, for example, Peripheral Component Interconnect express (PCIe™) or Serial Attached Small Computer System Interface (SAS) is used.

The printed circuit boards 21A to 21C are provided with through holes 212 for inserting the screws 142 that fix the board assembly 20 to the base 11. These through holes 212 are arranged corresponding to the screw holes 115 of the bottom wall 111 of the base 11. Further, the printed circuit board 21A arranged at the lowermost side is provided with the through hole 213 corresponding to the pin provided on the bottom wall 111 of the base 11. Further, the printed circuit boards 21A and 21B are provided with through holes 214 corresponding to pins 226 provided on the spacers 22A and 22B described later.

Each of the spacers 22A and 22B is interposed between two of the printed circuit boards 21A to 21C mutually adjacent in the Z-direction. Each of the spacers 22A and 22B holds a state where two of the printed circuit boards 21A to 21C mutually adjacent in the Z-direction have a predetermined interval therebetween. Further, each of the spacers 22A and 22B includes a function of making it difficult for devices arranged between two of the printed circuit boards 21A to 21C mutually adjacent in the Z-direction to be visually observed, through the ventilation holes 123. Each of the spacers 22A and 22B includes a frame part 221, which has almost the same dimensions as those of the printed circuit boards 21A to 21C and has almost the same outline as that of the printed circuit boards 21A to 21C, and a reinforcing part 222 or reinforcing parts 222a and 222b, which suppress deformation of the frame part 221 caused by an external force. The frame part 221 is provided with a plurality of engaging portions 223 of a snap fit type at predetermined positions. The plurality of engaging portions 223 are preferably arranged opposite to each other. In the example illustrated in FIG. 4, the engaging portions 223 are arranged on respective ones of a pair of long sides of the frame part 221, and are opposite to each other.

Each engaging portion 223 includes a cantilever projected downward from the frame part 221 at a predetermined position, and a protrusion provided at the distal end of the cantilever and projected toward the inside of the frame part 221. On the other hand, the printed circuit boards 21A and 21B are provided with cutouts 211 at the positions corresponding to the engaging portions 223, such that each cutout 211 is recessed by the thickness of the cantilever.

The frame part 221 is provided with through holes 225 for inserting the screws that fix the board assembly 20 to the base 11. Further, the frame part 221 is provided with a plurality of pins 226 projected downward. The pins 226 are used to perform positioning in the X-direction and Y-direction with respect to each of the printed circuit boards 21A and 21B to be fitted. Accordingly, the printed circuit boards 21A and 21B are provided with through holes 214 for fitting the pins 226 therein, at the corresponding positions.

In assembling, first, the printed circuit board 21A or 21B is put closer to the lower side of the spacer 22A or 22B. Then, while the positions of the through holes 214 of the printed circuit board 21A or 21B are set aligned with the positions of the pins 226 of the spacer 22A or 22B, the printed circuit board 21A or 21B is brought into contact with the spacer 22A or 22B. This results in a state where the protrusions of the engaging portions 223 are positioned on the lower surface side of the printed circuit board 21A or 21B, and engage with this lower surface. In this way, the printed circuit boards 21A and 21B are fixed to the spacers 22A and 22B.

The reinforcing parts 222, 222a, and 222b are arranged at any positions. For example, in the upper side spacer 22B in FIG. 4, the reinforcing part 222 is provided by connecting the opposite long sides almost in parallel with the short sides constituting the frame part 221. Further, in the lower side spacer 22A in FIG. 4, the first reinforcing part 222a is provided by connecting the opposite long sides almost in parallel with the short sides constituting the frame part 221, and the second reinforcing part 222b is provided by connecting the first reinforcing part 222a to one of a pair of the short sides almost in parallel with the long sides constituting the frame part 221. The second reinforcing part 222b is arranged to extend along the backside of the arrangement position of the controller package 23c.

The second reinforcing part 222b is provided with a raised portion 224 projected downward. In this example, the raised portion 224 is arranged within the arrangement position of the controller package 23c on the lowermost printed circuit board 21A. Between the raised portion 224 and the lowermost printed circuit board 21A, a heat conductive sheet 131 is interposed. The raised portion 224 has a height to come into contact with the heat conductive sheet 131 provided on the upper surface of the lowermost printed circuit board 21A. Consequently, heat generated by an operation of the controller package 23c mounted on the lower surface of the printed circuit board 21A is conducted to the upper surface of the printed circuit board 21A, and is further conducted to the spacer 22A through the heat conductive sheet 131. Then, the heat is released by air flows coming from the ventilation holes 123, i.e., openings. Further, as described above, the controller package 23c on the lower surface of the printed circuit board 21A is connected to the bottom wall 111 of the base 11 through a heat conductive sheet 131. Accordingly, heat generated by the controller package 23c is conducted also to the base 11 through the heat conductive sheet 131, and is released.

Further, in this example, between a portion of the second reinforcing part 222b which is above the arrangement position of the raised portion 224 and the nonvolatile memory packages 23a which is on the lower surface of the printed circuit board 21B, a heat conductive sheet 131 is interposed in contact with the both sides. Consequently, heat generated by the nonvolatile memory packages 23a is conducted to the spacer 22A through the heat conductive sheet 131, and is released by air flows coming from the ventilation holes 123.

The dimensions of the spacers 22A and 22B in the Z-direction are set such that devices mounted on the printed circuit boards 21A to 21C to be arranged above and below the spacers 22A and 22B do not interfere with each other.

The spacers 22A and 22B are made of an electrically insulating material that will not be thermally deformed by a temperature rise due to an operation of the controller package 23c and so forth, and that is high in resistance to impact shock and high in thermally conductive property. For example, the spacers 22A and 22B are made of polycarbonate resin.

Here, in the above example, each of the reinforcing parts 222 and 222a is provided by connecting a pair of opposite sides of the frame part 221; however, the embodiment is not limited to this. For example, each of the reinforcing parts 222 and 222a may be provided by connecting two sides of the frame part 221 that are not opposite to each other.

Next, with reference to FIGS. 3 and 4, an explanation will be given of a method of assembling such an electronic apparatus 1. First, as illustrated in FIG. 4, the board assembly 20 is assembled with the printed circuit boards 21A to 21C and the spacers 22A and 22B.

Specifically, while the through holes 214 of the printed circuit boards 21A and 21B and the pins 226 of the spacers 22A and 22B are set aligned with each other, the printed circuit boards 21A and 21B and the spacers 22A and 22B are put closer to each other in the Z-direction, and are fixed by the engaging portions 223 of the spacers 22A and 22B. In the illustrated example, the lowermost printed circuit board 21A and the spacer 22A are fixed to each other, and the middle printed circuit board 21B and the spacer 22B are fixed to each other. Then, the printed circuit boards 21A to 21C adjacent in the Z-direction are connected to each other by the board-to-board connectors 24. Consequently, the board assembly 20 is constructed in which the printed circuit boards 21A to 21C and the spacers 22A and 22B are alternately arranged in the Z-direction.

Then, as illustrated in FIG. 3, the electronic apparatus 1 is assembled. First, the heat conductive sheets 131 are stuck to the base 11 and the cover 12 at predetermined positions. Thereafter, while the through hole 213 of the lowermost printed circuit board 21A constituting the board assembly 20 is set aligned with the pin (not illustrated) of the base 11, the board assembly 20 is placed on the base 11. Then, the board assembly 20 is fixed to the base 11 by fasteners, such as the screws 142. Specifically, in this fixing, the screws 142 are set to pass through the through holes 212 of the printed circuit boards 21A to 21C constituting the board assembly 20 and the screw-insertion through holes 225 of the spacers 22A and 22B, and to reach the screw holes 115 of the base 11.

Thereafter, while the through holes 125 of the cover 12 are set aligned with the pins 114 provided on the side walls 112a of the base 11, the cover 12 is placed on the base 11. Then, the cover 12 is fixed to the base 11 by fasteners, such as the screws 141. Specifically, in this fixing, the screws 141 are set to pass through the through holes 124 provided on the cover 12, and to reach the screw holes 113 provided on the side walls of the base 11. Then, the nameplate label 151 is stuck to the upper surface of the cover 12, and thereby the electronic apparatus 1 is assembled.

Figure 5:
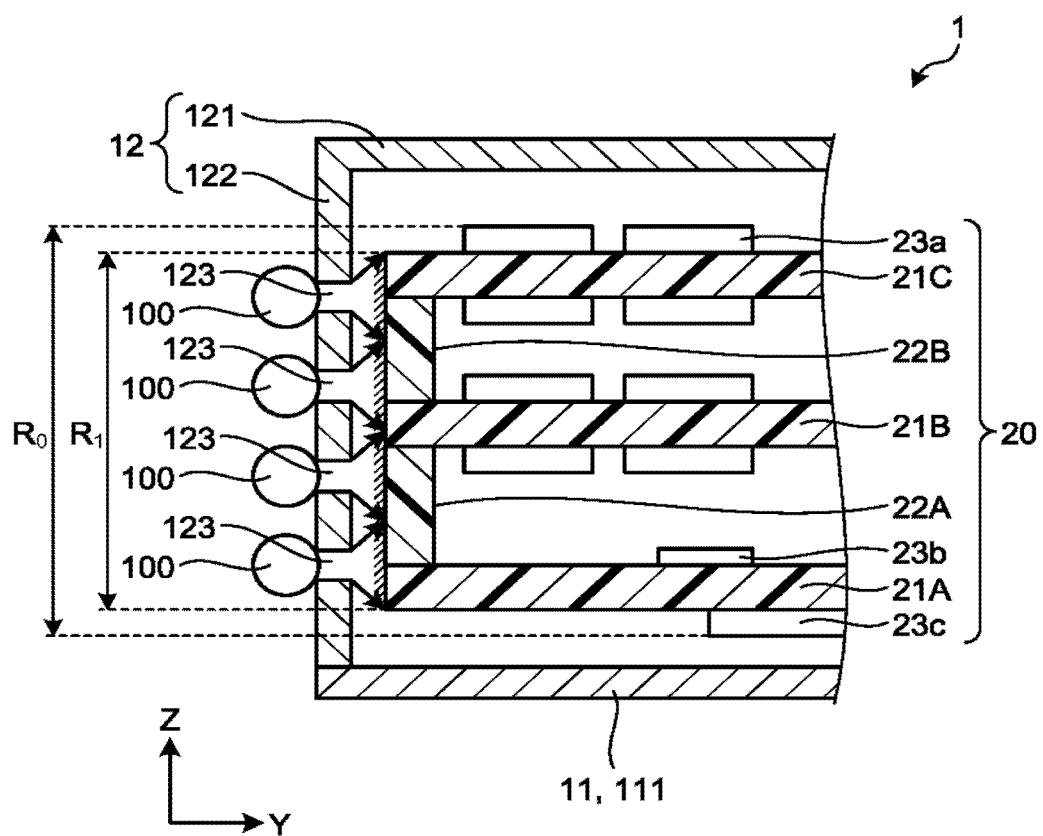
FIG. 5 is a sectional view schematically illustrating an example of the arrangement position of a controller package according to the first embodiment.

Next, an explanation will be given of the ventilation holes 123 provided on the electronic apparatus 1 that accommodates the board assembly 20. FIG. 5 is a sectional view schematically illustrating an example of the arrangement position of the controller package according to the first embodiment. For the sake of convenience in explanation, FIG. 5 illustrates a sectional view including one end in the Y-direction at a position where the connector 25 is not present. In FIG. 5, the constituent elements corresponding to those described above are denoted by the same reference symbols.

The housing 10 includes a side wall 122 formed with the ventilation holes 123 and arranged at one end in Y-direction. Now, it is assumed that, at the ventilation holes 123 of this side walls 122, artificial light sources 100 are placed to irradiate light (visible light) of which a wavelength is 400 nm to 750 nm. In FIG. 5, optical paths at outer edges of light emitted from each ventilation hole 123 are schematically illustrated by arrows, and the range of light emitted from each ventilation hole 123 is schematically illustrated by hatching of lines oblique downward to the left. This hatching is shown between the optical paths at two outer edges of light emitted from each ventilation hole 123.

In this case, an encryption module, i.e., the controller package 23c in this example, is arranged at a position where the light does not reach. For example, when it is assumed that, of the upper surface and lower surface of the board assembly 20, a light unreachable region is a first region and a light reachable region is a second region, the controller package 23c is arranged in the first region. Here, the upper surface and lower surface of the board assembly 20 within the range illustrated in FIG. 5 are the first region.

As described above, as the spacers 22A and 22B are interposed between the printed circuit boards 21A to 21C stacked in the Z-direction, devices arranged in the spaces between the printed circuit boards 21A to 21C cannot be visually observed through the ventilation holes 123. Further, as the controller package 23c, which is considered as the encryption module, is present in the first region, the encryption module (controller package 23c) is prevented from being visually observed through the ventilation holes 123.

Thus, in relation to the encryption module (for example, the controller package 23c), it is possible to prevent the production number, model number, design information (such as wire trace and internal structure), or assembling information from being visually observed through the ventilation holes 123.

Here, an explanation of the arrangement positions of the ventilation holes 123 in the Z-direction relative to the board assembly 20, which are set to prevent the encryption module from being visually observed, will be given. In the following examples, there are a case (A) where the encryption modules are arranged on both of the upper and lower surfaces of the board assembly 20; a case (B) where the encryption module is arranged on one of the upper and lower surfaces of the board assembly 20; and a case (C) where no encryption module is arranged on either of the upper and lower surfaces of the board assembly 20. Further, in the following examples, the encryption modules include the controller package 23c and the nonvolatile memory packages 23a.

In the case (A) where the encryption modules are arranged on both of the upper and lower surfaces of the board assembly 20:

In this case, as illustrated in FIG. 5, within an arrangement position range $R_0$ of the board assembly 20 in the Z-direction, the ventilation holes 123 provided on the housing 10 are arranged within a range $R_1$, which is between the upper surface and lower surface of the board assembly 20. This is to prevent light from reaching the upper surface and lower surface of the board assembly 20 when the artificial light sources 100 are placed at the ventilation holes 123. Consequently, the upper surface and lower surface of the board assembly 20 become the light unreachable first region. Thus, the nonvolatile memory packages 23a on the upper surface of the board assembly 20 and the controller package 23c on the lower surface of the board assembly 20 are arranged in the light unreachable first region.

Figure 6:
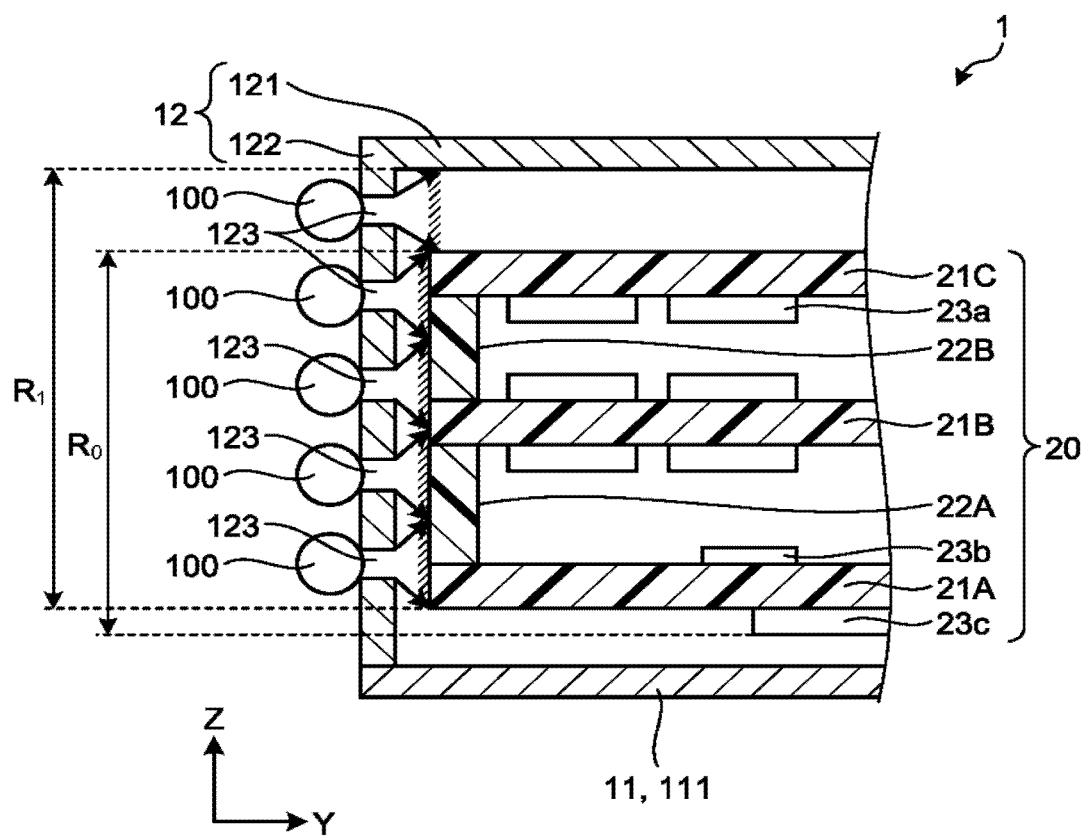
FIG. 6 is a side view schematically illustrating an example of the relation between the positions of ventilation holes and the position of the board assembly, according to the first embodiment.

In the case (B) where the encryption module is arranged on one of the upper and lower surfaces of the board assembly 20:

FIG. 6 is a side view schematically illustrating an example of the relation between the positions of the ventilation holes and the position of the board assembly, according to the first embodiment. FIG. 6 illustrates a case where the encryption module is arranged on the lower surface of the board assembly 20, for example. In this case, the ventilation holes 123 provided on the housing 10 are arranged within a range $R_1$ between the lower surface of the board assembly 20 and the top wall 121 of the cover 12. Accordingly, as long as this condition is satisfied, the ventilation holes 123 may be arranged also above the uppermost position of the arrangement position range $R_0$ of the board assembly 20 in the Z-direction.

In the example of FIG. 6, the upper surface of the board assembly 20 is the second region to be irradiated with light, and the lower surface of the board assembly 20 is the first region not to be irradiated with light. In this case, as the encryption module is not arranged on the upper surface side of the board assembly 20, the encryption module is prevented from being visually observed even if the upper surface of the board assembly 20 is irradiated with light from the artificial light sources 100 placed at the ventilation holes 123. On the other hand, as the ventilation holes 123 are not arranged below the lowermost position of the arrangement position range $R_0$ of the board assembly 20 in the Z-direction, the lower surface of the board assembly 20 will never be irradiated with light from the artificial light sources 100 placed at the ventilation holes 123.

Here, FIG. 6 illustrates a case where the encryption module is arranged on the lower surface of the board assembly 20. On the other hand, where the encryption module is arranged on the upper surface of the board assembly 20, the positional relations described above in the vertical direction become reverse to those illustrated in FIG. 6.

Further, if an alteration of firmware for controlling an operation of the electronic apparatus 1 can cause a problem in security, the encryption module including, for example, the nonvolatile memory packages 23a that store the firmware is preferably arranged at a position not to be visually observed.

Figure 7:
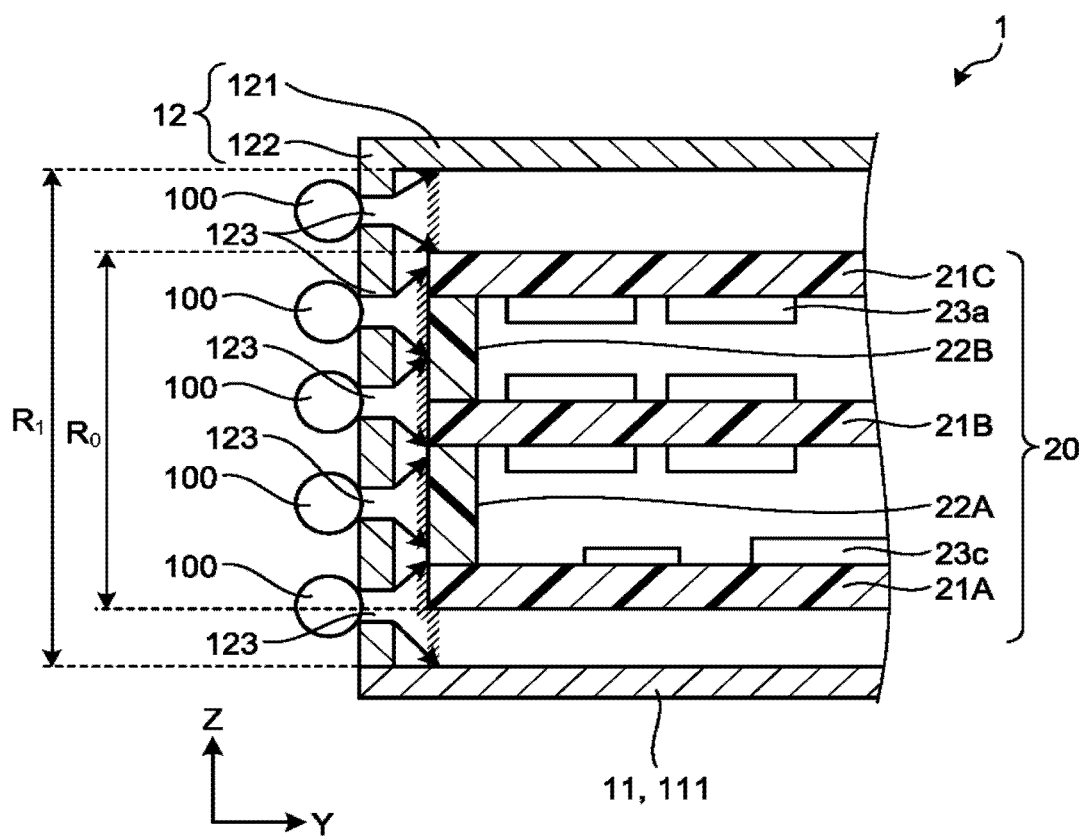
FIG. 7 is a side view schematically illustrating an example of the relation between the positions of ventilation holes and the position of the board assembly, according to the first embodiment.

In the case (C) where no encryption module is arranged on either of the upper and lower surfaces of the board assembly 20:

FIG. 7 is a side view schematically illustrating an example of the relation between the positions of ventilation holes and the position of the board assembly, according to the first embodiment. FIG. 7 illustrates a case where no encryption module is arranged on either of the upper and lower surfaces of the board assembly 20, for example. In this case, the ventilation holes 123 provided on the housing 10 are arranged at any positions within a range $R_1$, which is between the top wall 121 of the cover 12 and the bottom wall 111 of the base 11, regardless of the arrangement position range $R_0$ of the board assembly 20 in the Z-direction. In other words, the ventilation holes 123 may be arranged also above the uppermost position of the arrangement position range $R_0$ of the board assembly 20 in the Z-direction, or the ventilation holes 123 may be arranged also below the lowermost position of the arrangement position range $R_0$ of the board assembly 20 in the Z-direction.

In the example of FIG. 7, the upper surface and lower surface of the board assembly 20 become the second region to be irradiated with light. In this case, as the encryption module is not arranged on either of the upper surface side and lower surface side of the board assembly 20, the encryption module is prevented from being visually observed even if the upper surface and lower surface of the board assembly 20 are irradiated with light from the artificial light sources 100 placed at the ventilation holes 123.

Further, in this case, the encryption module results in being arranged in a region surrounded by the spacers 22A and 22B of the board assembly 20. In the region surrounded by the spacers 22A and 22B, the encryption module will never be irradiated with light from the artificial light sources 100 placed at the ventilation holes 123. In the example of FIG. 7, the controller package 23c is arranged on the upper surface of the lowermost printed circuit board 21A.

Further, if an alteration of firmware for controlling an operation of the electronic apparatus 1 can cause a problem in security, the encryption module including, for example, the nonvolatile memory packages 23a that store the firmware is preferably arranged at a position not to be visually observed.

Figure 8:
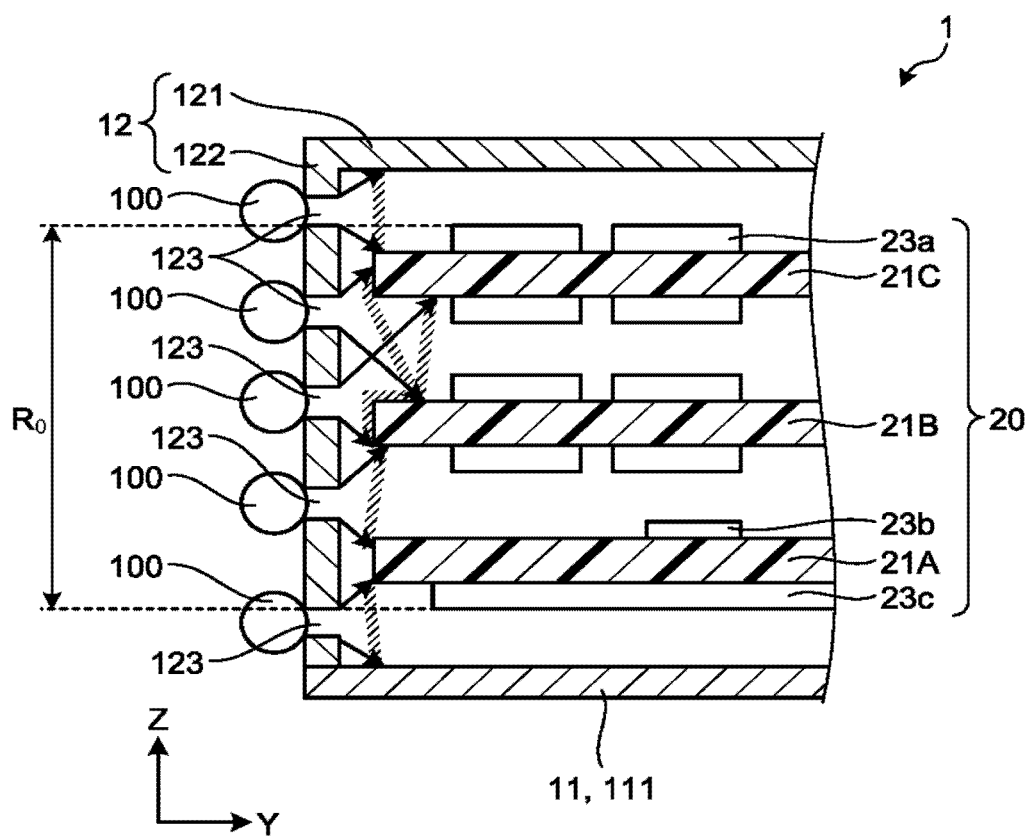
FIG. 8 is a side view schematically illustrating an example of the relation between the positions of ventilation holes and the position of the board assembly, according to a comparative example.

As a comparative example, an explanation will be given of the arrangement positions of the ventilation holes 123 in the Z-direction relative to the board assembly 20, in a case where the encryption modules are arranged on both of the upper and lower surfaces of the board assembly 20, and the encryption modules can be visually observed through the ventilation holes 123. FIG. 8 is a side view schematically illustrating an example of the relation between the positions of the ventilation holes and the position of the board assembly, according to the comparative example. FIG. 8 illustrates a case where the encryption modules are arranged on both of the upper and lower surfaces of the board assembly 20, for example.

As illustrated in FIG. 8, the ventilation holes 123 provided on the housing 10 are arranged also below the lowermost position of the arrangement position range $R_0$ of the board assembly 20 in the Z-direction, and arranged also above the uppermost position of the same. When the artificial light sources 100 are placed at the ventilation holes 123, the upper surface or lower surface of the board assembly 20 comes to include a portion to be irradiated with light. In the example of FIG. 8, the upper surface and lower surface of the board assembly 20 become the second region to be irradiated with light. When the encryption module is present in the second region, the encryption module can be visually observed through the ventilation holes 123. Further, as the spacers 22A and 22B are not provided between the printed circuit boards 21A to 21C adjacent in the Z-direction, the encryption module arranged between the printed circuit boards 21A to 21C adjacent in the Z-direction ends up being irradiated with light. In other words, the encryption module can be visually observed through the ventilation holes 123. Accordingly, from the viewpoint to prevent the encryption module from being visually observed, the arrangement of the ventilation holes 123 described above is inapposite.

Here, in the above description, it is designed to prevent the entirety of the encryption module from being visually observed. However, for example, where information to be protected from visual observation is the production number, model number, design information (such as wire trace and internal structure), or assembling information of the encryption module, it may be designed to allow part of the encryption module, such as its lateral surface, to be visually observed, as long as the information described above cannot be visually observed.

Further, the above description is exemplified by a case where the board assembly 20 accommodated in the housing 10 includes the three printed circuit boards 21A to 21C; however, the embodiment is not limited to this. The board assembly 20 may include one or more printed circuit boards.

Further, the above description is exemplified by a case where the spacers 22A and 22B respectively fix the printed circuit boards 21A and 21B positioned below by the engaging portions 223; however, the embodiment is not limited to this. The spacers 22A and 22B may respectively fix the printed circuit boards 21B and 21C positioned above by engaging portions 223.

Further, the above description is exemplified by a case where the ventilation holes 123 are provided on the side walls 122 of the cover 12; however, the ventilation holes 123 may be provided on the side walls 112a and 112b of the base 11. Further, the ventilation holes 123 are formed in a mesh shape on the side walls 122; however, the ventilation holes 123 may be formed in another shape, such as a slit or lattice shape.

Further, the above description is exemplified by a case where the ventilation holes 123 are provided on the side walls 122 of the cover 12; however, the embodiment may be applied to a case where the ventilation holes 123 are provided on the bottom wall 111, top wall 121, or another side wall of the housing 10, for example.

Further, the above description is exemplified by a case where the controller package 23c is considered as the encryption module or the controller package 23c and non-volatile memory packages 23a are considered as the encryption modules. However, where data to be treated in an encryption process is read into volatile memory packages 23b to perform the encryption process, these volatile memory packages 23b are also included in the encryption modules. The arrangement positions of the volatile memory packages 23b on the upper surface or lower surface of the board assembly 20 may be achieved by the same method as that described above.

In the first embodiment, between the printed circuit boards 21A to 21C adjacent in the Z-direction, the spacers 22A and 22B are interposed which are formed in a frame shape having almost the same outline as that of the printed circuit boards 21A to 21C. In this state, the printed circuit boards 21A to 21C and the spacers 22A and 22B are fixed to each other to form the board assembly 20, which is then accommodated in the housing 10 including the side walls 122 formed with the ventilation holes 123. Here, the controller package 23c is present in the first region of the board assembly 20 that is light unreachable when the board assembly 20 is irradiated with light from the artificial light sources 100 placed at the ventilation holes 123. Consequently, it is possible to prevent the controller package 23c from being visually observed from outside the housing 10.

In other words, it is designed to prevent the production number, model number, design information, such as wire trace and internal connection, or assembling information of the controller package 23c in the electronic apparatus 1 from being visually observed from outside the housing 10. As a result, it is possible to improve the reliability of the electronic apparatus 1 concerning its security.

Further, as the spacers 22A and 22B are made of a resin superior in heat radiation property, there is also an effect capable of releasing heat generated in the printed circuit boards 21A to 21C adjacent in the Z-direction. Further, the reinforcing parts 222, 222a, and 222b of the spacers 22A and 22B are provided with the raised portions 224, and the heat conductive sheets 131 are interposed between the raised portions 224 and the printed circuit boards 21A to 21C or devices mounted on the printed circuit boards 21A to 21C. Consequently, it is possible to conduct heat from the printed circuit boards 21A to 21C to the spacers 22A and 22B, and to release the heat by air flows from the ventilation holes 123 provided on the housing 10.

Further, the spacers 22A and 22B are provided with the pins 226 for positioning, and the printed circuit boards 21A and 21B are provided with through holes 214 at the positions corresponding to the pins. Consequently, by inserting the pins 226 of the spacers 22A and 22B into the through holes 214 of the printed circuit boards 21A and 21B, the printed circuit boards 21A and 21B can be easily attached to the spacers 22A and 22B in a state where the alignment therebetween has been achieved. Further, as the spacers 22A and 22B are provided with the engaging portions 223 of a snap fit type, the printed circuit boards 21A and 21B can be firmly fixed.

Second Embodiment

In the first embodiment, each spacer arranged between printed circuit boards adjacent in the thickness direction has a structure that surrounds the space between the printed circuit boards, and does not allow air coming from outside to flow into the space between the printed circuit boards. In the second embodiment, an explanation will be given of an electronic apparatus having a structure that allows air from outside to flow also into the space between printed circuit boards adjacent in the thickness direction.

Figure 9A:
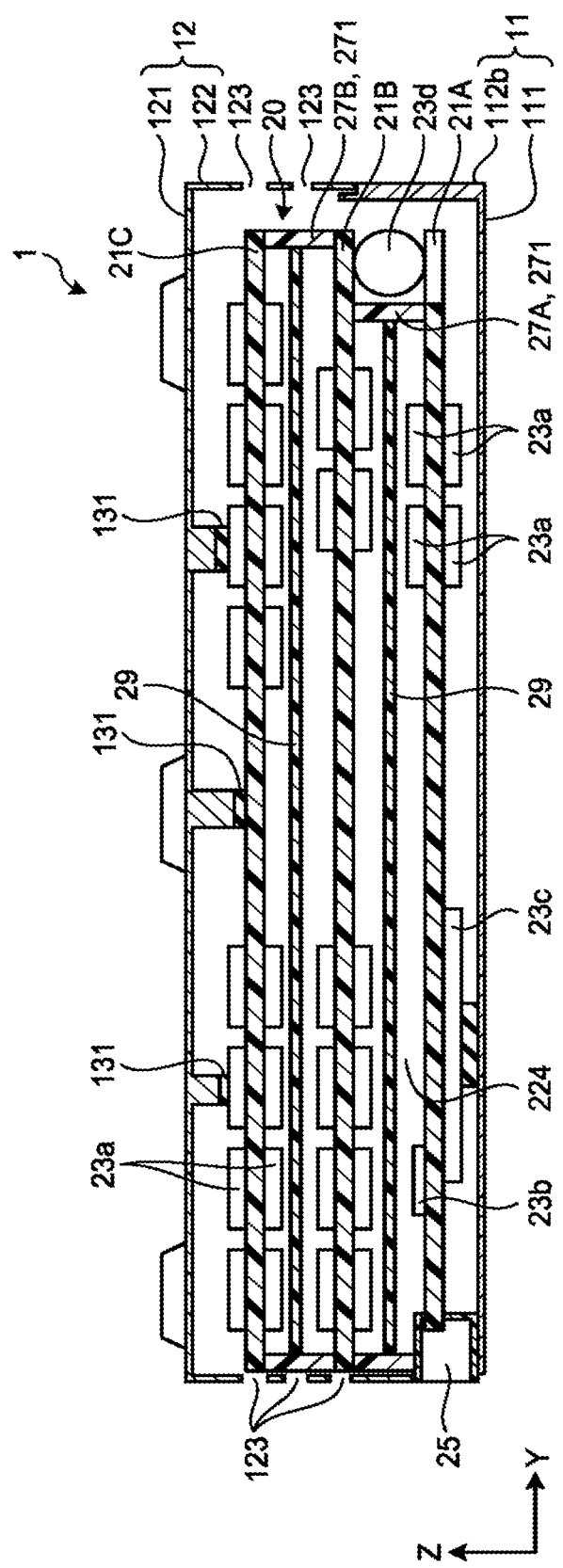
Figure 10:
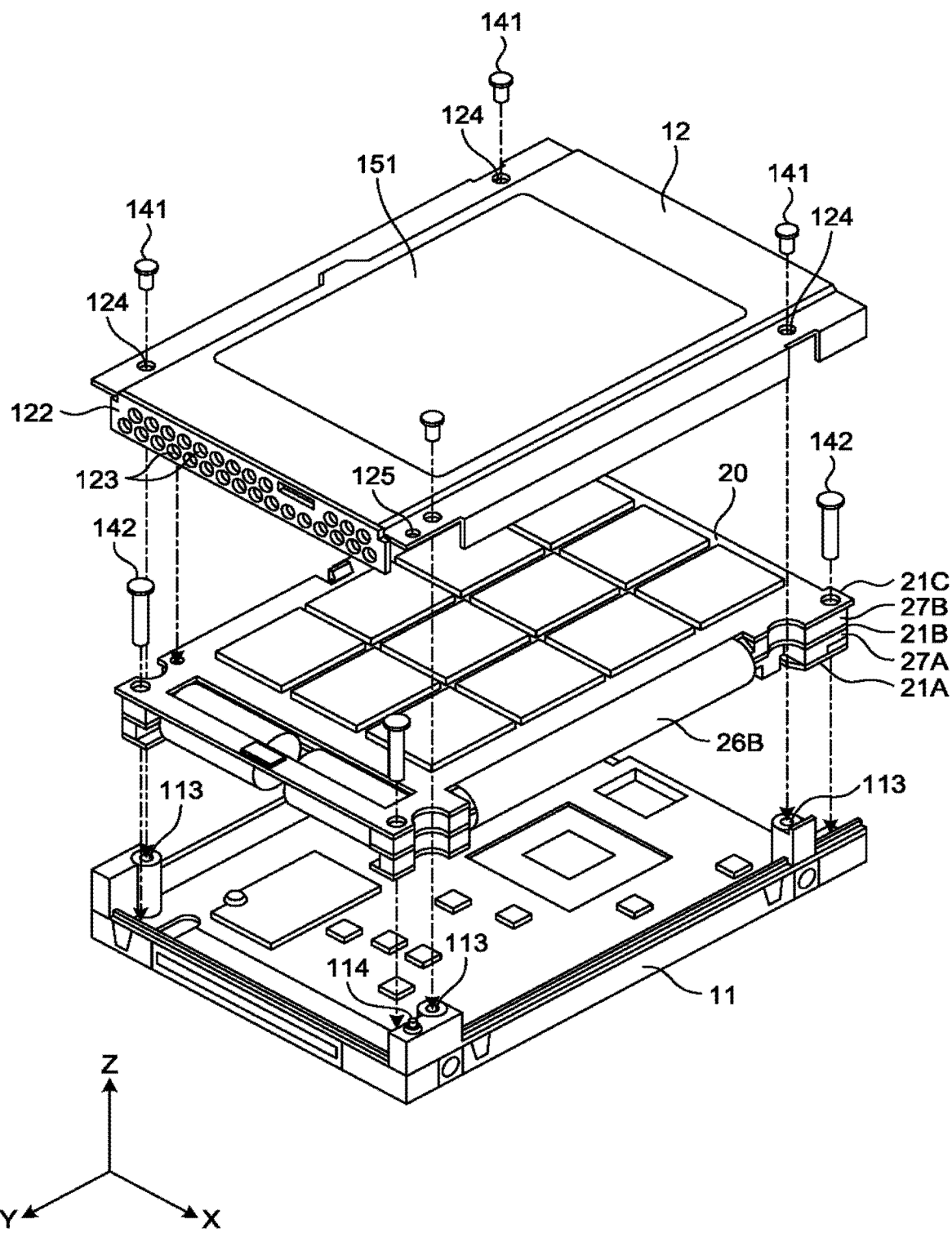
FIG. 10 is an exploded perspective view illustrating an example of the electronic apparatus according to the second embodiment.
Figure 11:
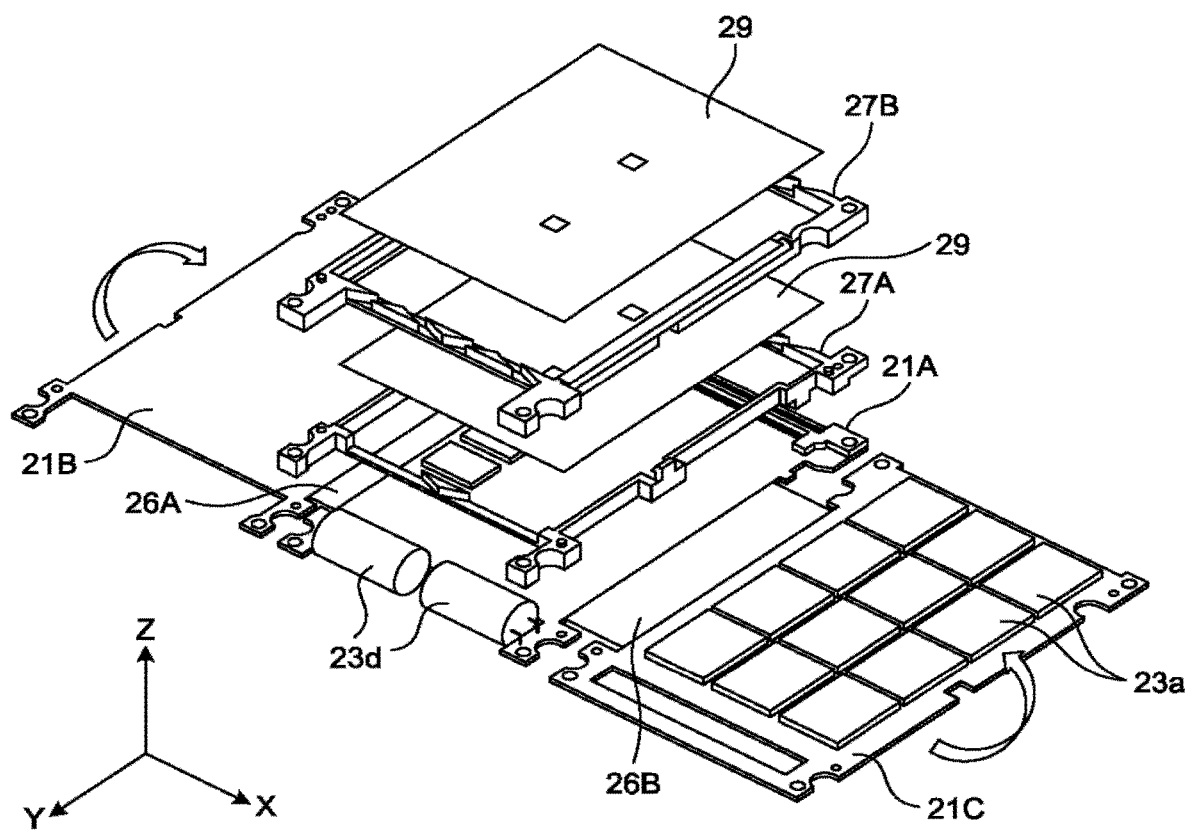
FIG. 11 is an exploded perspective view illustrating an example of a board assembly according to the second embodiment.
Figure 12A:
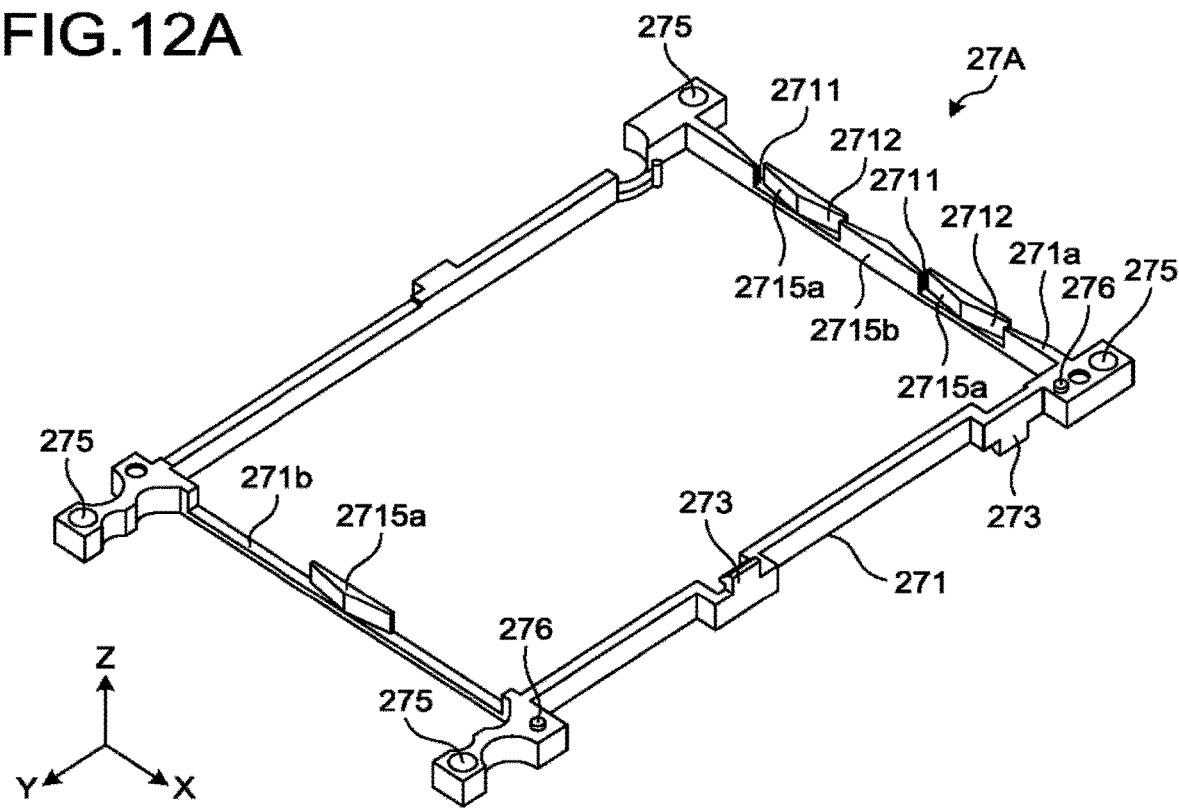
FIGS. 12A and 12B are perspective views illustrating an example of frames according to the second embodiment.
Figure 12B:
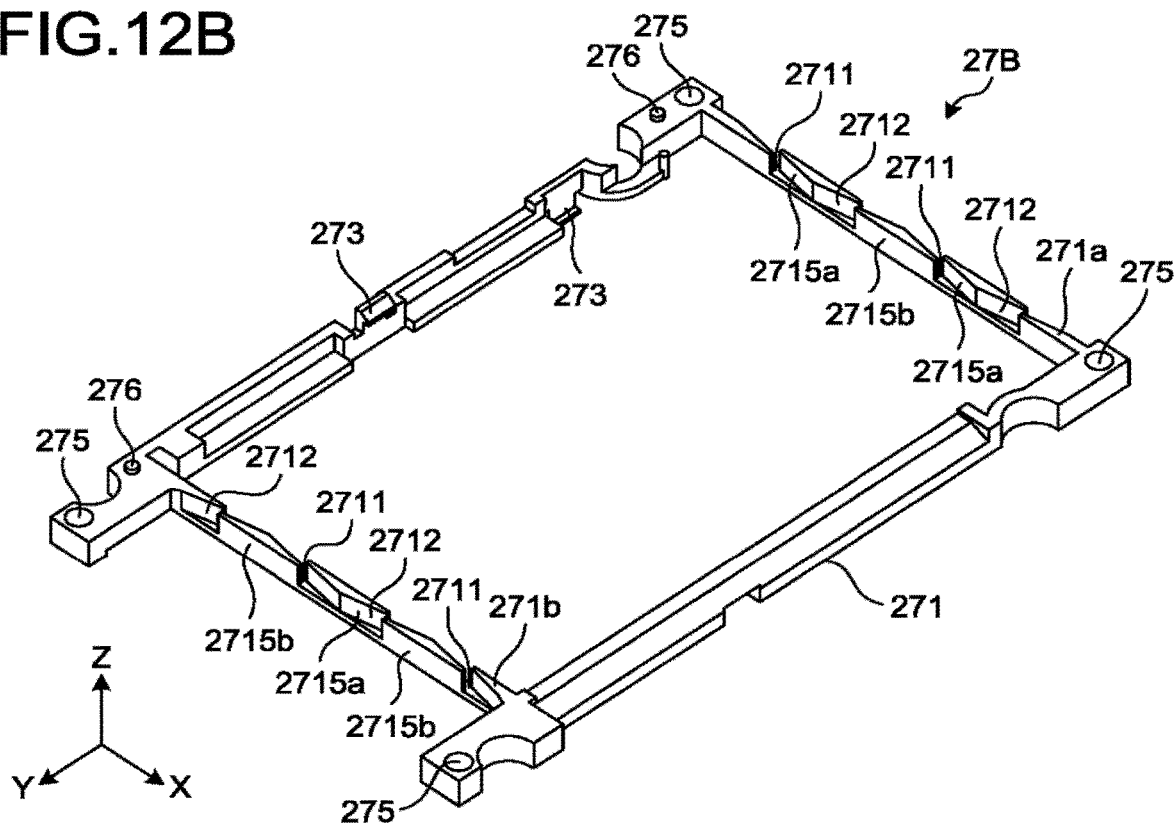
Figure 13A:
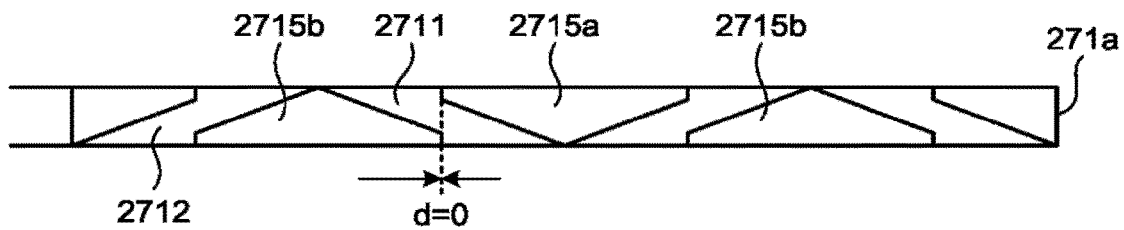
FIGS. 13A to 13C are top views illustrating examples of a ventilation mechanism of a frame according to the second embodiment.
Figure 13B:
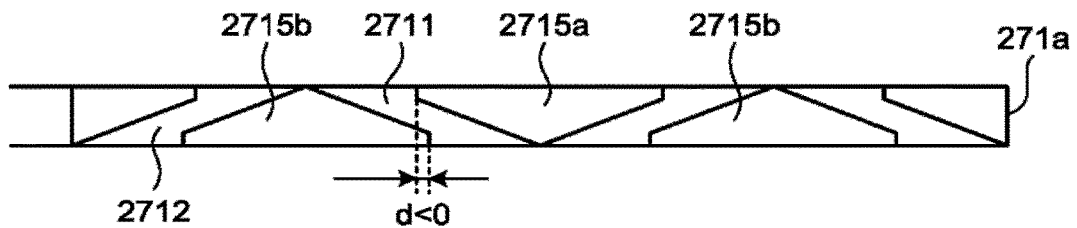
Figure 13C:
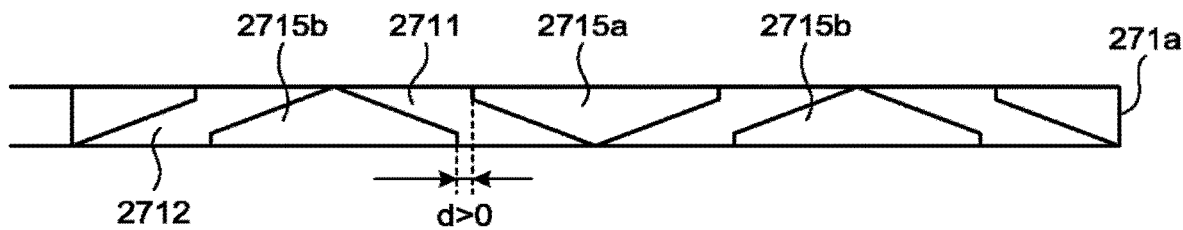

FIGS. 9A and 9B are sectional views illustrating an example of an internal configuration of an electronic apparatus according to the second embodiment. FIG. 9A is a sectional view in a direction perpendicular to the latitudinal direction. FIG. 9B is a sectional view in a direction perpendicular to the longitudinal direction. FIG. 10 is an exploded perspective view illustrating an example of the electronic apparatus according to the second embodiment. FIG. 11 is an exploded perspective view illustrating an example of a board assembly according to the second embodiment. FIGS. 12A and 12B are perspective views illustrating an example of frames according to the second embodiment. FIGS. 13A to 13C are top views illustrating examples of a ventilation mechanism of a frame according to the second embodiment. FIG. 14 is a perspective view illustrating another example of the ventilation mechanism of a frame according to the second embodiment. FIGS. 15A to 15E are views illustrating an example of an assembling sequence of the board assembly according to the second embodiment. Hereinafter, the electronic apparatus will be exemplified by an SSD, as in the first embodiment. Further, hereinafter, for the sake of convenience, it is assumed that the latitudinal direction of the rectangular top surface or bottom surface of the electronic apparatus 1 is an X-direction, its longitudinal direction is a Y-direction, and its thickness direction is a Z-direction. Further, hereinafter, the relative positional relations of components arranged in the Z-direction, i.e., their relations in the vertical direction, will be illustrated, by using as a reference the arrangement state of the electronic apparatus 1 illustrated in FIGS. 9A, 9B, and 10. Furthermore, hereinafter, an explanation of structures different from those of the first embodiment will be given, while no explanation of structures the same as those of the first embodiment will be given.

As illustrated in FIGS. 9A, 9B, and 10, in the electronic apparatus 1 according to the second embodiment, a housing 10 has the same structure as that of the first embodiment, and a pair of side walls 122 perpendicular to the Y-direction are provided with ventilation holes 123 for cooling, which allow air to flow between the outside and inside of the housing 10.

In the electronic apparatus 1 according to the second embodiment, a board assembly 20 includes a plurality of printed circuit boards and one or more spacers. The printed circuit boards and the spacers are alternately stacked in the Z-direction, and are fixed by fasteners. In this example, the board assembly 20 has a structure in which three printed circuit boards 21A, 21B, and 21C and two spacers 27A and 27B are alternately stacked in the Z-direction. Further, the board assembly 20 includes electrically insulating sheets 29 interposed between the printed circuit boards 21A and 21B adjacent in the Z-direction and between the printed circuit boards 21B and 21C adjacent in the Z-direction.

Each of the printed circuit boards 21A to 21C has a structure the same as that described in the first embodiment. However, in the first embodiment, the printed circuit boards 21A to 21C are electrically connected to each other by the board-to-board connectors 24; on the other hand, in the second embodiment, the printed circuit boards 21A to 21C are electrically connected to each other by flexible printed circuits (Flexible Printed Circuits, each of which will be referred to as "FPC") 26A and 26B.

As illustrated in FIG. 11, the printed circuit board 21A is arranged at the middle, the printed circuit board 21B is arranged at one side (left side in FIG. 11) of the printed circuit board 21A in the X-direction, and the printed circuit board 21C is arranged at the other side (right side in FIG. 11) of the printed circuit board 21A in the X-direction. The FPCs 26A and 26B each for electrically connecting two printed circuit boards are provided between the printed circuit boards 21A and 21B and between the printed circuit boards 21A and 21C. Each of the FPCs 26A and 26B is composed of a base layer made of a flexible and electrically insulating material and an electrically conductive layer made of an electrically conductive material bonded thereon. As the base layer, polyimide, polyethylene terephthalate, polyethylene naphthalate, or the like is used. As the electrically conductive layer, copper or the like is used. The electrically conductive layer is to be connected to the wiring layer of each printed circuit board.

In this example, the FPCs 26A and 26B are arranged at long sides of the printed circuit boards 21A to 21C. Further, the lengths of FPCs 26A and 26B have been determined in accordance with the stacking order of the printed circuit boards 21A to 21C. In this example, as the printed circuit board 21A, the printed circuit board 21B, and the printed circuit board 21C are to be stacked in this order from below, the length of the FPC 26B that connects the printed circuit boards 21A and 21C to each other is set larger than the length of the FPC 26A that connects the printed circuit boards 21A and 21B to each other.

Each of the spacers 27A and 27B is interposed between the two printed circuit boards 21A and 21B or two printed circuit boards 21B and 21C adjacent in the Z-direction. Each of the spacers 27A and 27B holds a state where the two printed circuit boards 21A and 21B or two printed circuit boards 21B and 21C adjacent in the Z-direction have a predetermined interval therebetween. Further, each of the spacers 27A and 27B includes a function of making it difficult for devices arranged between the two printed circuit boards 21A and 21B or two printed circuit boards 21B and 21C adjacent in the Z-direction to be visually observed, through the ventilation holes 123. Further, each of the spacers 27A and 27B includes a function of guiding part of the air flows from the ventilation holes 123 at one side of the housing 10 to the ventilation holes 123 at the other side, through the space between the two printed circuit boards 21A and 21B or two printed circuit boards 21B and 21C adjacent in the Z-direction.

Figure 15A:
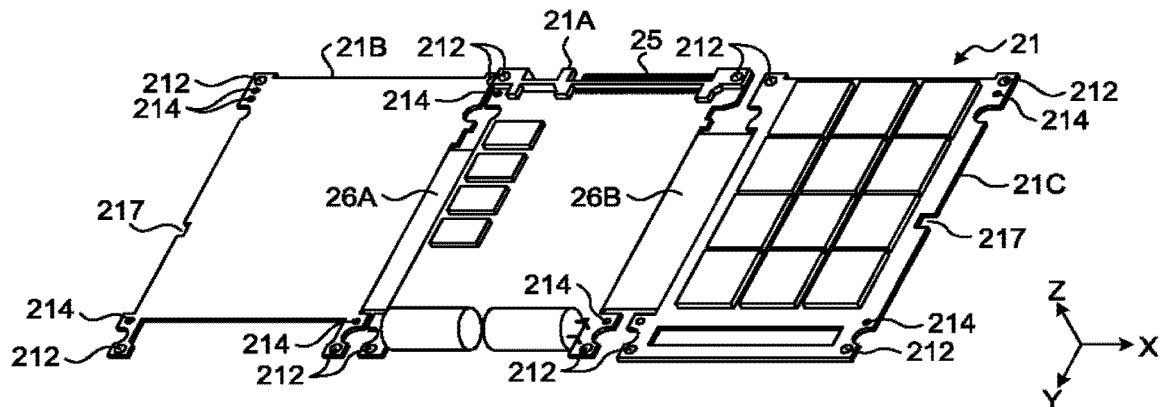
FIGS. 15A to 15E are views illustrating an example of an assembling sequence of the board assembly according to the second embodiment.

As illustrated in FIGS. 12A and 12B, each of the spacers 27A and 27B includes a frame part 271, which has almost the same outline as that of the printed circuit boards 21A to 21C. The frame part 271 is provided with a plurality of engaging portions 273 of a snap fit type at predetermined positions. In the example of FIGS. 12A and 12B, the engaging portions 273 are arranged on respective ones of the upper and lower sides of the frame part 271 in the Z-direction. Consequently, each of the spacers 27A and 27B comes to be fixed to two of the printed circuit boards 21A to 21C, which are arranged above and below this one of the spacers 27A and 27B in the Z-direction. Here, when the spacers 27A and 27B are seen in a state placed by the same orientation, the spacer 27A is provided with the engaging portions 273 on a long side at one side, and the spacer 27B is provided with the engaging portions 273 on a long side at the other side. The engaging portions 273 are preferably arranged at positions that prevent the printed circuit boards 21B and 21C from being opened up by a reaction force of the FPCs 26A and 26B when the board assembly 20 is assembled. Further, as illustrated in FIG. 15A, in accordance with the positions of the engaging portions 273, the printed circuit boards 21B and 21C are provided with recessed portions 217 on long sides opposite to the long sides provided with the FPCs 26A and 26B. When the printed circuit boards 21B and 21C are fixed to the spacers 27A and 27B, the engaging portions 273 engage with the recessed portions 217; thus, the printed circuit boards 21B and 21C are fixed, and are prevented from being opened up by a reaction force of the FPCs 26A and 26B.

The frame part 271 is provided with through holes 275 for inserting the screws 142 that fix the board assembly 20 to the base 11. Further, the frame part 271 is provided with a plurality of pins 276 projected downward and upward. The pins 276 are used to perform positioning in the X-direction and Y-direction with respect to each of the printed circuit boards 21A and 21B to be fitted. Accordingly, the printed circuit boards 21A to 21C are provided with through holes 214 for fitting the pins 276 therein, at the corresponding positions.

As illustrated in FIG. 11, in assembling, first, the spacers 27A and 27B are respectively put closer to the upper sides of the printed circuit boards 21A and 21B. Then, while the positions of the pins 276 of the spacers 27A and 27B are set aligned with the positions of the through holes 214 of the printed circuit boards 21A and 21B, the spacers 27A and 27B are respectively brought into contact with the printed circuit boards 21A and 21B. This results in a state where the protrusions of the engaging portions 273 are positioned on the lower surface sides of the printed circuit boards 21A and 21B, and engage with these lower surfaces. Further, the printed circuit boards 21B and 21C are respectively put closer to the upper sides of the spacers 27A and 27B. Then, while the positions of the through holes 214 of the printed circuit boards 21B and 21C are set aligned with the positions of the pins 276 of the spacers 27A and 27B, the printed circuit boards 21B and 21C are respectively brought into contact with the spacers 27A and 27B. This results in a state where the protrusions of the engaging portions 273 are positioned on the upper surface sides of the printed circuit boards 21B and 21C, and engage with these upper surfaces. In this way, the printed circuit boards 21A to 21C are fixed to the spacers 27A and 27B.

As illustrated in FIGS. 12A and 12B, the side surface 271a of the frame part 271 to be opposite to the ventilation holes 123 is provided with a ventilation mechanism. The ventilation mechanism is configured such that slits are formed in the side surface 271a of the frame part 271. As illustrated in FIG. 12A, two types of slits 2711 and 2712 different in direction are alternately formed in the side surface 271a along the X-direction. As a result, wall portions 2715a and 2715b, each of which has a pentagonal shape with an apex protrusive in the Y-direction, are formed at places surrounded by the two types of slits 2711 and 2712. The pentagonal wall portions 2715a and 2715b adjacent in the X-direction have different apex directions, that is, one of them is toward a positive direction side in the Y-direction and the other is toward a negative direction side in the Y-direction.

Further, as illustrated in FIGS. 9A and 11, the spacer 27A is arranged on the lower side in the Z-direction. Further, the printed circuit board 21A is arranged below the spacer 27A in the Z-direction, and capacitors 23d are arranged at one end of the printed circuit board 21A in the Y-direction. The capacitors 23d are present outside a side surface 271b of the frame part 271. The two capacitors 23d present in the X-direction serve to block the field of vision into the board assembly 20. Accordingly, as illustrated in FIG. 12A, the side surface 271b of spacer 27A is structured such that no side surface portion is formed at the positions where the capacitors 23d are to be arranged, but one pentagonal wall portion 2715a is formed to be present between the two capacitors 23d.

On the other hand, in the spacer 27B arranged on the upper side in the Z-direction, as illustrated in FIG. 12B, the side surfaces 271a and 271b to be opposite to the ventilation holes 123 are provided with pentagonal wall portions 2715a and 2715b.

As illustrated in FIGS. 13A to 13C, it is assumed that, when the side surfaces 271a and 271b are seen in the Y-direction, the distance between the mutually adjacent ends of the pentagonal wall portions 2715a and 2715b is denoted by "d". The distance between the mutually adjacent ends of the pentagonal wall portions 2715a and 2715b is preferably set to be zero as illustrated in FIG. 13A, i.e., there should be no gap between the mutually adjacent ends of the pentagonal wall portions 2715a and 2715b. Alternatively, the distance between the mutually adjacent ends of the pentagonal wall portions 2715a and 2715b is preferably set to be negative, i.e., there should be a partial overlap near the mutually adjacent ends of the pentagonal wall portions 2715a and 2715b. With this arrangement, as described in the first embodiment, it is possible to prevent the encryption module in the board assembly 20 from being visually observed through the ventilation holes 123 of the housing 10. However, as the ventilation holes 123 provided on the side walls 122 of the housing 10 are formed in a mesh shape, the net portions between the ventilation holes 123 overlap with the slits of the side surface 271a of the frame part 271, and make it difficult for the encryption module inside to be visually observed. Accordingly, as illustrated in FIG. 13C, it may be designed to leave a gap of about 0.1 to 0.2 mm between the mutually adjacent pentagonal wall portions 2715a and 2715b. If the distance "d" between the mutually adjacent ends of the pentagonal wall portions 2715a and 2715b is larger than 0.2 mm, it may become possible for the encryption module inside to be visually observed. Thus, the distance "d" is preferably set to be up to 0.2 mm.

Here, the slits 2711 and 2712 provided on the spacers 27A and 27B are a mere example, and another structure may be provided instead. For example, as illustrated in FIG. 14, slits 2712 may be formed in parallel with each other on the side surface 271a or side surface 271b of the frame part 271 along the X-direction. In this case, wall portions 2715c, each of which has a parallelogram shape, are formed at places surrounded by respective sets of mutually adjacent two slits 2712. The distance between the mutually adjacent ends of the parallelogram wall portions 2715c also satisfies the relation described with reference to FIGS. 13A to 13C. Other than this, a slit structure which allows air to flow through the inside of the board assembly 20 and makes it difficult for the inside to be visually observed may be used. Further, for example, the spacers 27A and 27B are made of polycarbonate resin.

The electrically insulating sheets 29 are interposed between the printed circuit boards 21A to 21C mutually adjacent in the Z-direction. The electrically insulating sheets 29 serve to prevent devices on the printed circuit boards 21A to 21C mutually adjacent in the Z-direction from being damaged by coming into contact with each other, and to relax impact shock when the electronic apparatus 1 receives the impact shock. Further, each electrically insulating sheet 29 includes a function of electrically insulating the portion between two of the printed circuit boards 21A to 21C mutually adjacent.

Next, with reference to FIGS. 15A to 15E, an explanation of a method of assembling such the electronic apparatus 1 will be given. However, since a method of fixing the board assembly 20 to the housing 10 to assemble the electronic apparatus 1 is the same as that described in the first embodiment, its description will be omitted; thus, a method of assembling the board assembly 20 by using the printed circuit boards 21A to 21C, the spacers 27A and 27B, and the electrically insulating sheets 29 will be described.

Here, as illustrated in FIG. 15A, a group 21 of the printed circuit boards connected by the FPCs 26A and 26B is placed in an unfolded state. In this example, in a state where the connector 25 of the printed circuit board 21A is present on the upper side in FIG. 15A, the printed circuit board 21B is present at the left side of the printed circuit board 21A next to the FPC 26A, and the printed circuit board 21C is present at the right side of the printed circuit board 21A next to the FPC 26B.

Figure 15B:
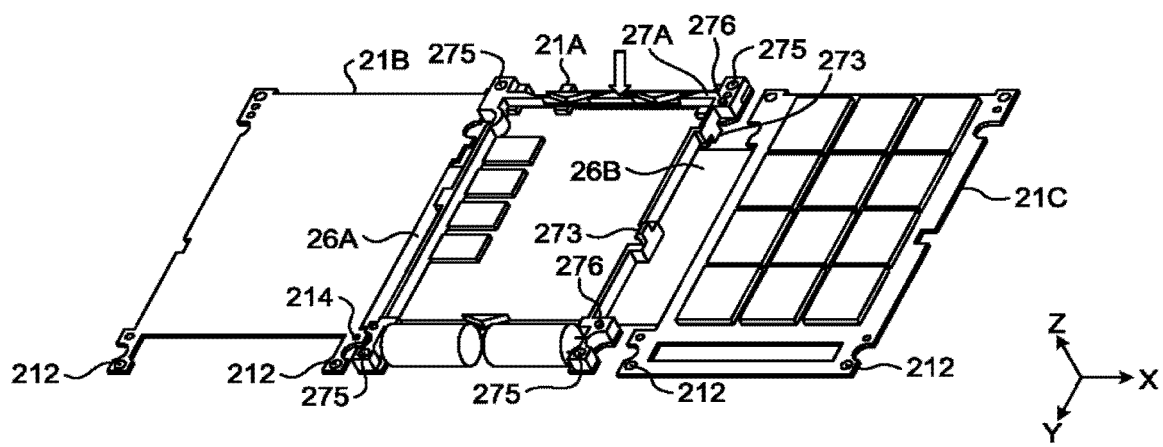

Then, as illustrated in FIG. 15B, while the pins (not illustrated) on the lower side of the spacer 27A are set aligned with the through holes 214 of the printed circuit board 21A at the middle, the spacer 27A is put closer to the printed circuit board 21A from above in the Z-direction. Then, the spacer 27A is fixed to the printed circuit board 21A by the engaging portion 273 on the lower side of the spacer 27A.

Figure 15C:
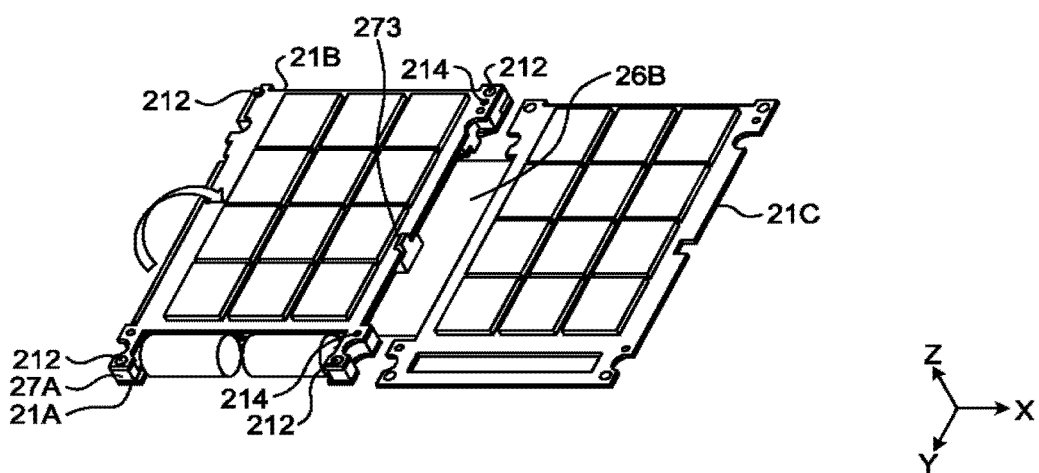

Thereafter, the electrically insulating sheet 29 (not illustrated) is placed on the printed circuit board 21A with the spacer 27A attached thereon. Then, as illustrated in FIG. 15C, the printed circuit board 21B is folded back above the printed circuit board 21A. At this time, while the through holes 214 of the printed circuit board 21B are set aligned with the pins 276 on the upper side of the spacer 27A, the printed circuit board 21B is put closer to the spacer 27A from above in the Z-direction. Then, the printed circuit board 21B is fixed to the spacer 27A by the engaging portion 273 on the upper side of the spacer 27A.

Figure 15D:
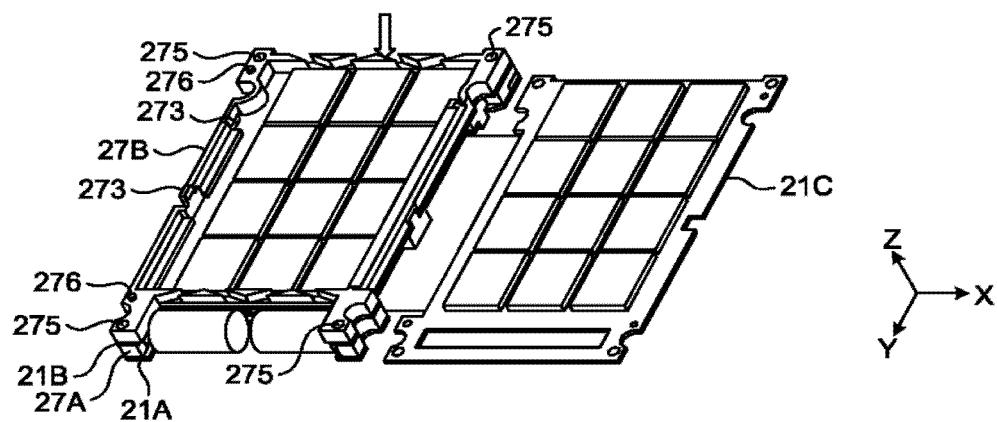

Then, as illustrated in FIG. 15D, while the pins (not illustrated) on the lower side of the spacer 27B are set aligned with the through holes 214 of the printed circuit board 21B, the spacer 27B is put closer to the printed circuit board 21B from above in the Z-direction. Then, the spacer 27B is fixed to the printed circuit board 21B by the engaging portion 273 on the lower side of the spacer 27B.

Figure 15E:
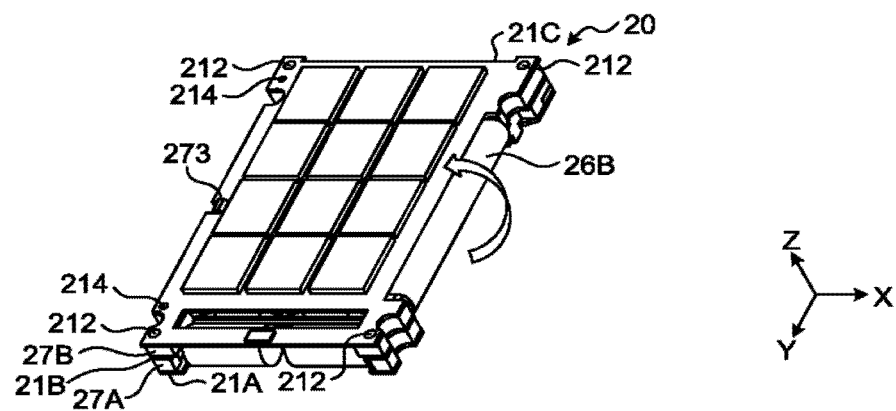

Thereafter, the electrically insulating sheet 29 (not illustrated) is placed on the printed circuit board 21B with the spacer 27B attached thereon. Then, as illustrated in FIG. 15E, the printed circuit board 21C is folded back above the printed circuit board 21B. At this time, while the through holes 214 of the printed circuit board 21C are set aligned with the pins 276 on the upper side of the spacer 27B, the printed circuit board 21C is put closer to the spacer 27B from above in the Z-direction. Then, the printed circuit board 21C is fixed to the spacer 27B by the engaging portion 273 on the upper side of the spacer 27B. As a result, the board assembly 20 is constructed.

Here, in the second embodiment, the board assembly 20 is assembled by using the group 21 of the printed circuit boards in which the printed circuit boards 21A to 21C are mutually connected by the FPCs 26A and 26B. However, the spacers 27A and 27B including the slits described above may be used for a board assembly 20 having a structure in which the printed circuit boards 21A to 21C are connected to each other by the board-to-board connectors 24 described in the first embodiment. Further, also in the second embodiment, the relation between the positions of the ventilation holes 123 of the housing 10 and the arrangement position of the encryption module in the board assembly 20 satisfies the relation described in the first embodiment.

In the second embodiment, between the printed circuit boards 21A to 21C adjacent in the Z-direction, the spacers 27A and 27B are interposed which have almost the same outline as that of the printed circuit boards 21A to 21C. The spacers 27A and 27B include the side surfaces 271$a$ and 271$b$ formed with the slits and being opposite to the ventilation holes 123 of the housing 10. In this state, the printed circuit boards 21A to 21C and the spacers 27A and 27B are set to form the board assembly 20, which is then accommodated in the housing 10. Consequently, air flows from the ventilation holes 123 of the housing 10, through the slits on one side of the spacers 27A and 27B, also into the board assembly 20, and is exhausted from the slits on the other side. Thus, there is an effect capable of improving the cooling effect on devices that generate heat inside the board assembly 20. Particularly, there is a case where the controller package 23$c$, which is formed of the SoC and is large in heat generation, is attached to the lower surface, in the Z-direction, of the printed circuit board 21A. In this case, heat is conducted also to the upper surface, in the Z-direction, of the printed circuit board 21A, at the position where the controller package 23$c$ is attached. Accordingly, when air flows along the Y-direction through the slits of the spacer 27A, the back side at the position where the controller package 23$c$ is attached is cooled by air.

Further, when the side walls 122 of the housing 10 provided with the ventilation holes 123 are seen in the Y-direction, the net portions of the housing 10 overlap with the slits of the spacers 27A and 27B. This makes it difficult for the inside of the board assembly 20 to be visually observed through the slits. Further, when the ends of wall portions of the spacers 27A and 27B provided at positions opposite to the ventilation holes 123 are set to overlap with each other, the inside of the board assembly 20 can be prevented from being visually observed through the slits, when seen in the Y-direction. Consequently, it is possible to improve the reliability of the electronic apparatus 1 concerning its security.

Third Embodiment

In the first and second embodiments, the ventilation hole provided on the housing are formed in a mesh shape, and the side surfaces or the like of the board assembly, as long as no encryption module is on them, can be visually observed through the ventilation holes. In the third embodiment, an explanation of an electronic apparatus that does not allow the inside of the housing to be visually observed through the ventilation holes provided on the housing will be given.

Figure 16A:
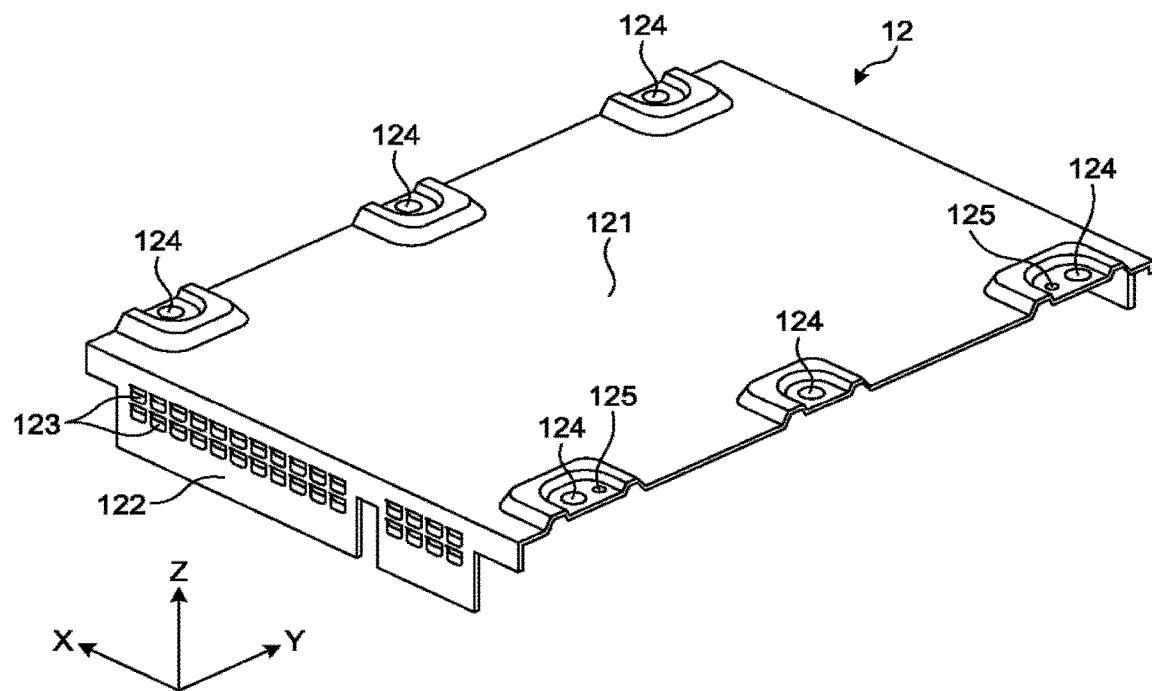
FIGS. 16A and 16B are views illustrating an example of the cover of a housing according to a third embodiment.
Figure 16B:
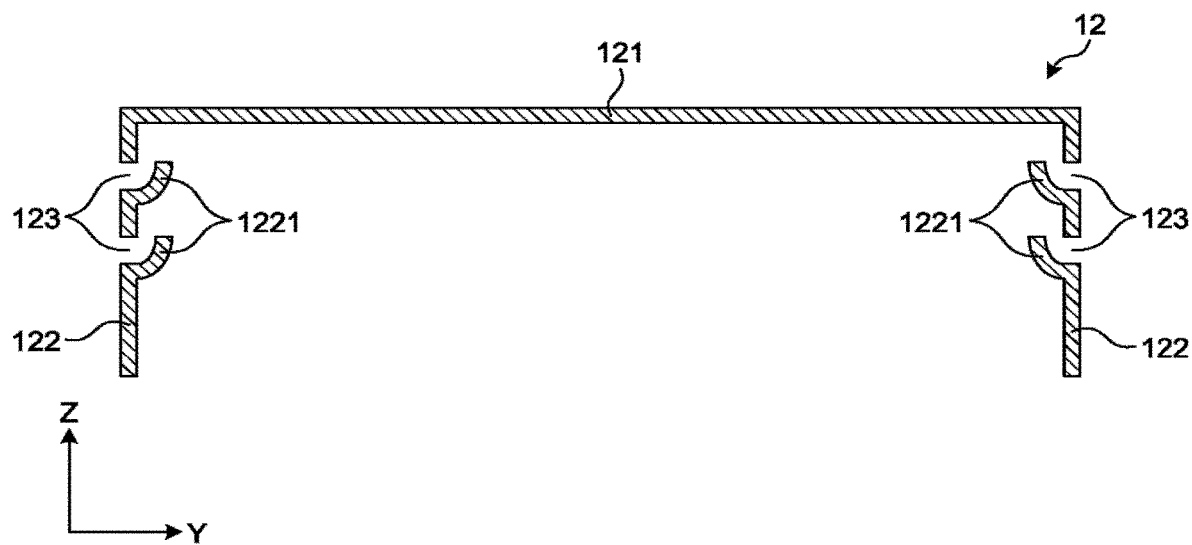
Figure 17:
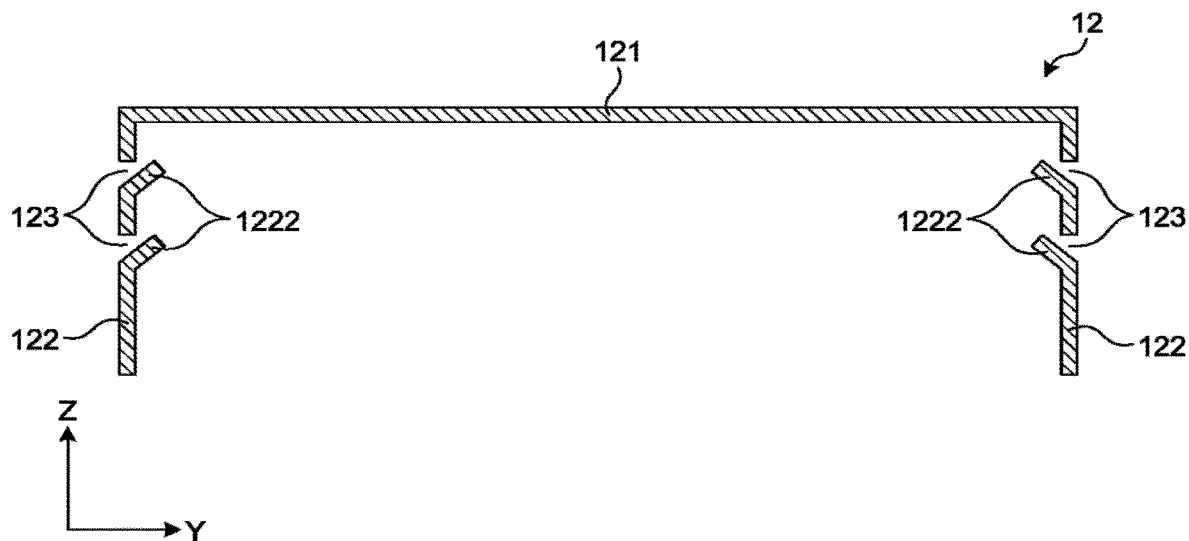
FIG. 17 is a sectional view illustrating another example of the cover of the housing according to the third embodiment.
Figure 18:
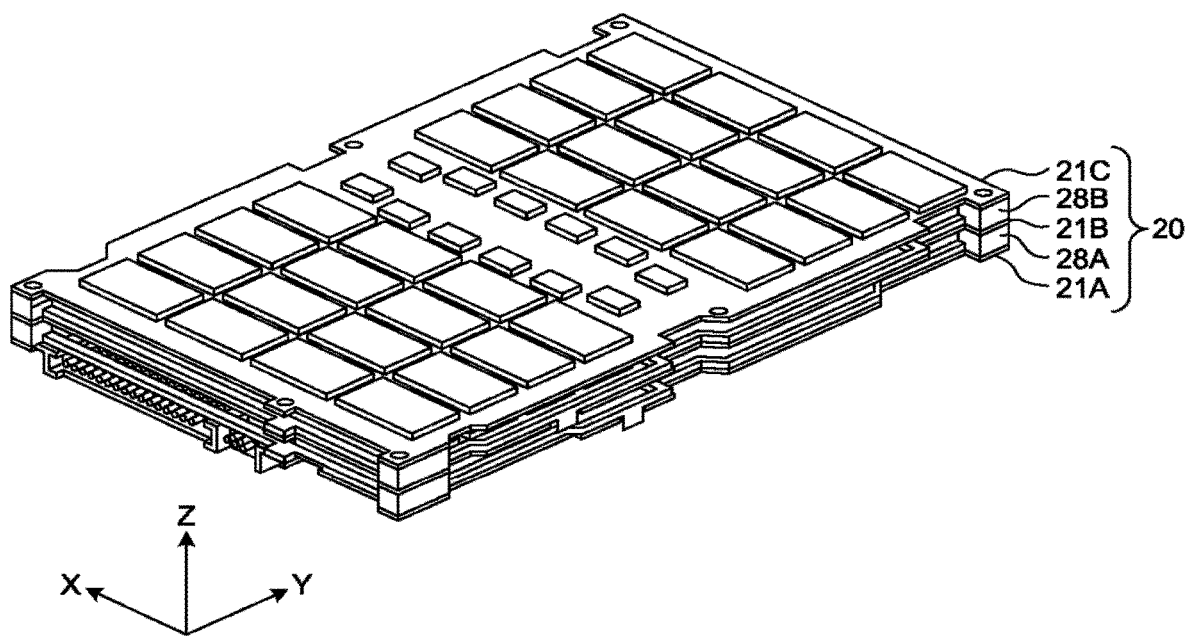
FIG. 18 is a perspective view illustrating an example of a board assembly according to the third embodiment.
Figure 19:
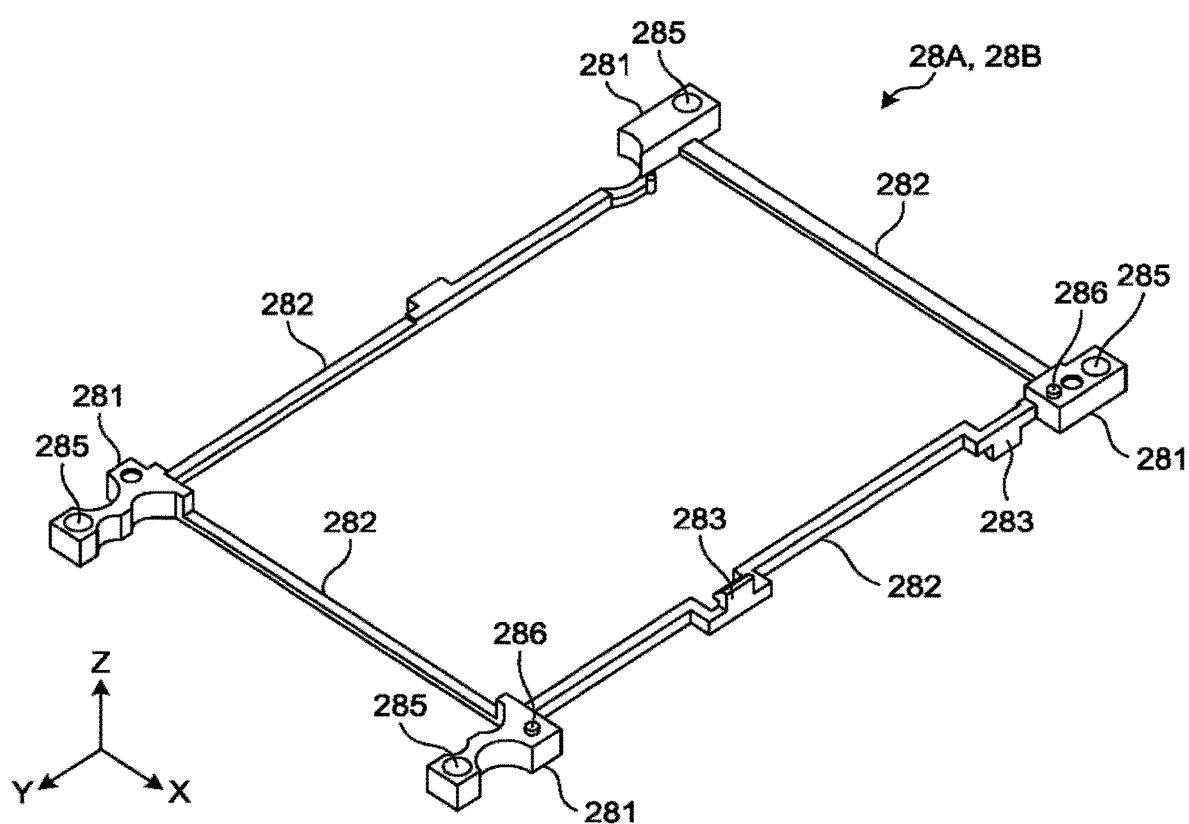
FIG. 19 is a perspective view illustrating a configuration example of a spacer according to the third embodiment.

FIGS. 16A and 16B are views illustrating an example of the cover of a housing according to a third embodiment. FIG. 16A is a perspective view, and FIG. 16B is a sectional view. FIG. 17 is a sectional view illustrating another example of the cover of the housing according to the third embodiment. FIG. 18 is a perspective view illustrating an example of a board assembly according to the third embodiment. FIG. 19 is a perspective view illustrating a configuration example of a spacer according to the third embodiment.

In the third embodiment, as illustrated in FIGS. 16A and 16B, each ventilation hole 123 formed on the side walls 122 of the cover 12 is provided with a recessed portion 1221 formed by louver working. The recessed portion 1221 is formed with its lower end and both ends in the X-direction continued to the surface of the corresponding side wall 122, and formed with an inclined surface bent toward the inside of the housing 10 and extending upward within the range of the corresponding ventilation hole 123. The position of the upper end of the recessed portion 1221 is almost the same as the position of the upper end of the corresponding ventilation hole 123. In other words, the recessed portion 1221 is arranged to substantially cover the corresponding ventilation hole 123 from visual observation on the housing 10 in the Y-direction. Accordingly, when the housing 10 is visually observed in the Y-direction, the inside of the housing 10 is prevented from being visually observed. Here, FIGS. 16A and 16B illustrate a structure in which the recessed portion 1221 is formed on the lower end side of the corresponding ventilation hole 123, and causes air to flow upward. However, this is a mere example, and the recessed portion 1221 may be formed at the corresponding ventilation hole 123 to cause air to flow sideward or downward.

Further, as illustrated in FIG. 17, each ventilation hole 123 formed on the side walls 122 of the cover 12 may be provided with a cut-and-raised portion 1222 formed by press working. The cut-and-raised portion 1222 is formed with its lower end continued to the surface of the corresponding side wall 122, and formed with an inclined surface present on the inner side of the housing 10 and extending upward within the range of the corresponding ventilation hole 123. The position of the upper end of the cut-and-raised portion 1222 is almost the same as the position of the upper end of the corresponding ventilation hole 123. In other words, the cut-and-raised portion 1222 is arranged so that it can cover the corresponding ventilation hole 123 when the housing 10 is visually observed in the Y-direction. Here, FIG. 17 illustrates a structure in which the cut-and-raised portion 1222 is formed on the lower end side of each ventilation hole 123, and causes air to flow upward. However, this is a mere example, and the cut-and-raised portion 1222 may be formed at each ventilation hole 123 to cause air to flow sideward or downward.

As described above, each ventilation hole 123 on the side walls 122 of the housing 10 is provided with a blindfold, such as the recessed portion 1221 or cut-and-raised portion 1222, not to allow the inside of the housing 10 to be visually observed. Consequently, it is possible to improve the reliability of the electronic apparatus 1 concerning its security. Here, as a spacer used for the board assembly 20 according to the third embodiment, either one of the spacers described in the first and second embodiments can be used; furthermore, a spacer which does not have a structure described in the first and second embodiments, which prevents the encryption module from being visually observed from outside, may be used. As illustrated in FIG. 18, it is sufficient if spacers 28A and 28B have a structure that can hold a state where the printed circuit boards 21A to 21C adjacent in the Z-direction have predetermined intervals therebetween.

Each of the spacers 28A and 28B has almost the same dimensions as those of the printed circuit boards 21A to 21C, and has almost the same outline as that of the printed circuit boards 21A to 21C, which is substantially rectangular. As illustrated in FIG. 19, each of the spacers 28A and 28B includes column members 281 arranged near the four corners to maintain, at a predetermined interval therebetween, two of the printed circuit boards 21A to 21C mutually adjacent in the Z-direction, and beam members 282 connecting the column members 281 to each other. In the third embodiment, the thickness of each beam member 282 in the Z-direction is set smaller than that of each column member 281. Accordingly, when the board assembly 20 has been assembled, gaps are formed as passages of air flow between the printed circuit boards 21A to 21C adjacent in the Z-direction.

The beam members 282 are provided with a plurality of engaging portions 283 of a snap fit type at predetermined positions. In the example of FIG. 19, the engaging portions 283 are arranged on respective ones of the upper and lower sides in the Z-direction. Consequently, each of the spacers 28A and 28B comes to be fixed to two of the printed circuit boards 21A to 21C, which are arranged above and below this one of the spacers 28A and 28B in the Z-direction. Here, as in the second embodiment, it may be designed such that, when the spacers 28A and 28B are seen in a state placed by the same orientation, the spacer 28A is provided with the engaging portions 283 on a long side at one side, and the spacer 28B is provided with the engaging portions 283 on a long side at the other side. In a case where the FPCs 26A and 26B form the connection between the printed circuit boards 21A and 21B and the connection between the printed circuit boards 21B and 21C, as in the second embodiment, the engaging portions 283 are preferably arranged at positions that prevent the printed circuit boards 21B and 21C from being opened up by a reaction force of the FPCs 26A and 26B when the board assembly 20 is assembled. Further, as illustrated in FIG. 15A, in accordance with the positions of the engaging portions 283, the printed circuit boards 21B and 21C are provided with recessed portions 217 on long sides opposite to the long sides provided with the FPCs 26A and 26B. When the printed circuit boards 21B and 21C are fixed to the spacers 28A and 28B, the engaging portions 283 engage with the recessed portions 217; thus, the printed circuit boards 21B and 21C are fixed, and are prevented from being opened up by a reaction force of the FPCs 26A and 26B.

The column members 281 are provided with through holes 285 for inserting the screws 142 that fix board assembly 20 to the base 11. Further, the column members 281 are provided with a plurality of pins 286 projected downward and upward. The pins 286 are used to perform positioning in the X-direction and Y-direction with respect to each of the printed circuit boards 21A to 21C to be fitted. Accordingly, the printed circuit boards 21A to 21C are provided with through holes 214 for fitting the pins 286 therein, at the corresponding positions.

Here, the constituent elements corresponding to those of the first and second embodiments are denoted by the same reference symbols, and their description will be omitted. Further, as a method of assembling the electronic apparatus 1 according to the third embodiment, the same method as that described in the first or second embodiment may be used. Further, also in the third embodiment, the arrangement position of the encryption module in the board assembly 20 is set at a position that cannot be visually observed through the ventilation holes 123 of the housing 10, as in the first embodiment.

In the third embodiment, each ventilation hole 123 of the housing 10 is provided with a blindfold. Consequently, even though the ventilation mechanism is provided, it is possible to prevent the inside of the housing 10 from being visually observed. Further, as a structure of the housing 10 is used to prevent the inside of the housing 10 from being visually observed, it is possible to determine the arrangement position of the encryption module in the board assembly 20 inside the housing 10 and the arrangement positions of the ventilation holes 123, without suffering from the restriction described in the first embodiment. Further, for the board assembly 20, a spacer can be used which does not have a structure for preventing an encryption module from being visually observed from outside. In this case, it is possible to further improve flows of air into the board assembly 20.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid state drive comprising:
a first printed circuit board having a first main surface and a second main surface, the second main surface opposing the first main surface;
a flash memory;
a first encryption device mounted on the first main surface, the first encryption device being configured to encrypt data to be stored in the flash memory; and
a housing including a wall and a first plate, the housing accommodating the first printed circuit board, the flash memory, and the first encryption device,
the wall including a first region and a second region, the first region including an opening, the second region including no opening,
the first plate having a first surface, the first surface facing the first main surface of the first printed circuit board,
wherein
the second region of the wall is bounded by a first position and a second position,
the first position being a position where the wall is intersected by an imaginary extension of the first main surface of the first printed circuit board,
the second position being a position where the wall is intersected by an imaginary extension of the first surface of the first plate.

2. The solid state drive according to claim 1, wherein the first encryption device is not irradiated with light emitted from a light source if the light source is placed at the opening.

3. The solid state drive according to claim 2, further comprising:
a second printed circuit board having a third main surface and a fourth main surface, the fourth main surface opposing the third main surface, the third main surface facing the second main surface of the first printed circuit board; and
a second encryption device mounted on the fourth main surface, the second encryption device being configured to encrypt data to be stored in the flash memory, wherein
the housing further accommodates the second printed circuit board and the second encryption device,
the housing further includes a second plate having a second surface, the second surface facing the fourth main surface of the second printed circuit board,
the wall further includes a third region, the third region including no opening, wherein
the third region is bounded by a third position and a fourth position,
the third position being a position where the wall is intersected by an imaginary extension of the fourth main surface of the second printed circuit board,
the fourth position being a position where the wall is intersected by an imaginary extension of the second surface of the second plate, and the second encryption device is not irradiated with light emitted from the light source if the light source is placed at the opening.

4. The solid state drive according to claim 3, further comprising:
a third encryption device mounted on the second main surface of the first printed circuit board, the third encryption device being configured to encrypt data to be stored in the flash memory; and
a spacer interposed between the first printed circuit board and the second printed circuit board, a part of the spacer being located between the opening and the third encryption device, wherein
a side of the part of the spacer facing the opening is irradiated with light emitted from the light source if the light source is placed at the opening, and
the third encryption device is not irradiated with light emitted from the light source if the light source is placed at the opening.

5. The solid state drive according to claim 4, wherein the spacer includes a slit configured to allow air to flow from the opening into a region that is surrounded by the first printed circuit board, the second printed circuit board, and the spacer.

6. The solid state drive according to claim 4, wherein the wall is perpendicular to the first plate and the second plate.

7. The solid state drive according to claim 4, wherein each of the first encryption device, the second encryption device, and the third encryption device includes one of a controller package, a volatile memory package, and a flash memory package, the controller package accommodating a controller chip configured to control the flash memory, the volatile memory package accommodating a volatile memory chip, the flash memory package accommodating a flash memory chip.

8. The solid state drive according to claim 1, wherein the wall is perpendicular to the first plate.

9. The solid state drive according to claim 1, wherein the first encryption device and the first surface of the first plate are respectively in contact with both sides of a heat conductive member that is placed between the first encryption device and the first plate.

10. The solid state drive according to claim 1, wherein the first encryption device includes a controller package, the controller package accommodating a controller chip configured to control the flash memory.

11. A solid state drive comprising:
a first printed circuit board having a first main surface and a second main surface, the second main surface opposing the first main surface;
a second printed circuit board having a third main surface and a fourth main surface, the fourth main surface opposing the third main surface, the third main surface facing the second main surface of the first printed circuit board;
a spacer interposed between the first printed circuit board and the second printed circuit board, the spacer including a first part and a second part, a gap between the first part and the second part forming a first slit;
a flash memory;
an encryption device mounted on the second main surface of the first printed circuit board, the encryption device being configured to encrypt data to be stored in the flash memory; and a housing including a first wall, the housing accommodating the first printed circuit board, the second printed circuit board, the spacer, the flash memory, and the encryption device, the first wall including at least one first opening, wherein the first part of the spacer and the second part of the spacer locate between the first opening and the encryption device, and the first part of the spacer or the second part of the spacer is placed such that the first part of the spacer or the second part of the spacer blocks light emitted from a light source not to irradiate the encryption device if the light source is placed at the first opening.

12. The solid state drive according to claim 11, wherein the first slit of the spacer is configured to allow air to flow from the first opening into a region that is surrounded by the first printed circuit board, the second printed circuit board, and the spacer.

13. The solid state drive according to claim 12, wherein the housing further includes a second wall facing the first wall, the second wall including a second opening, the spacer further includes a third part and a fourth part respectively facing the first part and the second part, a gap between the third part and the fourth part forming a second slit, the third part and the fourth part being located between the second opening and the encryption device, and the second slit of the spacer is configured to allow air flowed from the first opening into the region to flow out through the second opening.

14. The solid state drive according to claim 11, wherein the at least one first opening comprises a plurality of first openings, the first wall includes a mesh-shaped portion, the mesh-shaped portion forming the plurality of first openings, and a net portion of the mesh-shaped portion between two adjacent first openings overlaps the first slit of the spacer when seen in a direction perpendicular to the first wall.

15. The solid state drive according to claim 11, wherein the first part of the spacer and the second part of the spacer are formed with no distance therebetween when seen in a direction perpendicular to the first wall.

16. The solid state drive according to claim 11, wherein the first part of the spacer and the second part of the spacer are formed with a distance therebetween when seen in a direction perpendicular to the first wall.

17. The solid state drive according to claim 11, wherein at least one of the first part of the spacer and the second part of the spacer has a polygonal shape when seen in a first direction, the first direction being parallel to the first wall.

18. The solid state drive according to claim 17, wherein an apex having the largest angle among angles of the polygonal-shaped first part of the spacer protrudes in a second direction, the second direction being perpendicular to the first wall, and an apex having the largest angle among angles of the polygonal-shaped second part of the spacer protrudes in a third direction, the third direction being perpendicular to the first wall and opposite to the second direction.

19. The solid state drive according to claim 17, wherein the polygonal shape is a pentagon.

20. The solid state drive according to claim 11, wherein the encryption device includes one of a controller package, a volatile memory package, and a flash memory package, the controller package accommodating a controller chip configured to control the flash memory, the volatile memory package accommodating a volatile memory chip, the flash memory package accommodating a flash memory chip.

* * * * *